(12) United States Patent
Sakio et al.

(10) Patent No.: US 11,008,646 B2
(45) Date of Patent: *May 18, 2021

(54) VAPOR DEPOSITION APPARATUS, VAPOR DEPOSITION METHOD AND METHOD OF MANUFACTURING ORGANIC EL DISPLAY APPARATUS

(71) Applicant: Sakai Display Products Corporation, Osaka (JP)

(72) Inventors: Susumu Sakio, Osaka (JP); Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/854,078

(22) Filed: Apr. 21, 2020

(65) Prior Publication Data
US 2020/0263288 A1 Aug. 20, 2020

Related U.S. Application Data

(63) Continuation of application No. 15/757,420, filed as application No. PCT/JP2017/029814 on Aug. 21, 2017, now Pat. No. 10,669,620.

(51) Int. Cl.
*C23C 14/04* (2006.01)
*H01L 51/00* (2006.01)
(Continued)

(52) U.S. Cl.
CPC ........ *C23C 14/042* (2013.01); *H01L 51/0011* (2013.01); *H01L 51/001* (2013.01); *H01L 51/56* (2013.01); *H05B 33/10* (2013.01)

(58) Field of Classification Search
CPC ..... C23C 4/0005; C23C 14/04; C23C 14/042; C23C 14/044; C23C 16/04; C23C 16/042;
(Continued)

(56) References Cited

U.S. PATENT DOCUMENTS 4,431,505 A 2/1984 Morrison, Jr.
5,272,735 A 12/1993 Bryan et al.
(Continued)

FOREIGN PATENT DOCUMENTS

JP H1136075 A 2/1999
JP 2000505152 A 4/2000
(Continued)

OTHER PUBLICATIONS

English Translation of International Search Report, PCT Application No. PCT/JP2017/029814, Japan Patent Office, dated Sep. 12, 2017.

*Primary Examiner* — Aiden Lee
(74) *Attorney, Agent, or Firm* — Snell & Wilmer L.L.P.

(57) ABSTRACT

A vapor deposition apparatus disclosed by an embodiment comprises: a vacuum chamber (8); a mask holder (15) for holding a deposition mask 1; a substrate holder (29) for holding a substrate for vapor deposition (2); an electromagnet (3) disposed above a surface; a vapor deposition source 5 for vaporizing or sublimating a vapor deposition material; and a heat pipe (7) including at least a heat absorption part (71) and a heat dissipation part (72), the heat absorption part being in contact with the electromagnet (3), and the heat dissipation part being derived to an outside of the vacuum chamber (8). The heat pipe (7) and the electromagnet (3) are in intimate contact with each other at an area of a contact part between the heat pipe (7) and the electromagnet (3), the area being equal to or more than a cross-sectional area within an inner perimeter of a coil (32).

12 Claims, 10 Drawing Sheets

(51) Int. Cl.
*H01L 51/56* (2006.01)
*H05B 33/10* (2006.01)

(58) Field of Classification Search
CPC ......... C23C 8/04; C23C 10/04; C23C 14/046;
C23C 14/048; C23C 16/045; C23C
16/047; C23C 18/06; C23C 18/1603;
C23C 18/1605; C23C 18/1607; C30B
25/04; H01J 1/52; H01J 1/53; H01J 1/54;
H01J 1/56; H01J 1/58; H01J 1/60; H01J
1/62; H01J 2229/07; H01J 2229/0705;
H01J 2229/0711; H01J 2229/0716; H01J
2229/0722; H01J 2229/0727; H01J
2229/0733; H01J 2229/0738; H01J
2229/0744; H01J 2229/075; H01J
2229/0755; H01J 2229/0761; H01J
2229/0766; H01J 2229/0772; H01J
2229/0777; H01J 2229/0783; H01J
2229/0788; H01J 2229/0794; H01J
2229/8633; H01J 2229/8637; H01J
2229/8638; H01J 2229/8909; H01J
2229/8911; H01J 2237/026; H01J
2237/0262; H01J 2237/0264; H01J
2237/0266; H01J 2237/31718; H01J
2237/3172; H01J 2237/31723; H01J
2237/31727; H01J 2237/31728; H01J
2237/31761; H01J 2237/31762; H01J
2237/31764; H01J 2237/31766; H01J
2237/31767; H01J 2237/31794; H01J
29/06; H01J 29/07; H01J 29/073; H01J
29/076; H01J 29/08; H01J 29/10; H01J
29/12; H01J 29/14; H01J 29/16; H01J
29/18; H01J 29/182; H01J 29/185; H01J
29/187; H01J 31/08; H01J 31/16; H01J
31/18; H01J 31/20; H01J 31/22; H01J
31/24; H01J 31/40; H01J 31/42; H01J
31/52; H01J 31/54; H01J 37/32651
USPC .................. 118/715–733; 156/345.1–345.55
See application file for complete search history.

(56) References Cited

U.S. PATENT DOCUMENTS

| | | |
|---|---|---|
| 6,083,364 A | 7/2000 | Ikeda et al. |
| 6,431,948 B1 | 8/2002 | Atoh |
| 2007/0218706 A1 | 9/2007 | Matsuoka |
| 2010/0036523 A1 | 2/2010 | Sato et al. |
| 2010/0081355 A1 | 4/2010 | Inoue et al. |
| 2010/0206222 A1 | 8/2010 | Sung et al. |
| 2012/0204794 A1 | 8/2012 | Ko |
| 2014/0326275 A1* | 11/2014 | Kim ................ H01J 37/32862 134/1.1 |
| 2016/0104561 A1 | 4/2016 | Noh et al. |
| 2017/0163302 A1 | 6/2017 | Saeidi et al. |

FOREIGN PATENT DOCUMENTS

| | | |
|---|---|---|
| JP | 2001230172 A * | 8/2001 |
| JP | 2008024956 A | 2/2008 |
| JP | 2008059757 A | 3/2008 |
| JP | 2010084204 A | 4/2010 |
| JP | 2010209459 A | 9/2010 |
| JP | 2011195907 A | 10/2011 |
| WO | 9829704 | 7/1998 |
| WO | 2008026524 A1 | 3/2008 |

* cited by examiner

VAPOR DEPOSITION APPARATUS, VAPOR DEPOSITION METHOD AND METHOD OF MANUFACTURING ORGANIC EL DISPLAY APPARATUS

CROSS-REFERENCE TO RELATED APPLICATIONS

This patent application is a continuation of U.S. application Ser. No. 15/757,420, having a 371(c) date of Jul. 29, 2018, which is a U.S. National Stage of PCT/JP2017/029814, filed on 21 Aug. 2017, the entire disclosures of which are incorporated by reference.

TECHNICAL FIELD

The present invention relates to a vapor deposition apparatus, a vapor deposition method, and a method of manufacturing an organic electro-luminescence (EL) display apparatus including a step of vapor-depositing an organic layer.

BACKGROUND ART

For example, when an organic EL display apparatus is manufactured, a driving element, such as a thin-film-transistor (TFT), an electrode, and so on are formed on a supporting substrate, and organic layers are deposited on the electrode disposed on the supporting substrate, for each pixel. The organic layers are susceptible to moisture and thus cannot be etched. For this reason, the organic layers are deposited by overlapping and arranging a deposition mask on the supporting substrate (substrate for vapor deposition), and vapor-depositing organic materials through openings formed in the deposition mask. Consequently, necessary organic materials are deposited only on the electrodes of necessary pixels. The substrate for vapor deposition and the deposition mask must be positioned as close as possible. Otherwise, the organic layer could not be formed only on the accurate area of the pixel. If the organic material is not deposited exclusively on the accurate area of the pixel, a displayed image is more likely to become unclear. As such, a magnetic chuck is utilized to place the substrate for vapor deposition and a deposition mask close to each other by using a magnetic material as the deposition mask and interposing the substrate for vapor deposition between a permanent magnet or an electromagnet and the deposition mask (for example, see Patent Document 1).

CITATION LIST

Patent Literature

[PTL 1] JP 2008-024956 A

SUMMARY OF THE INVENTION

Problem to be Solved by the Invention

Although a metal mask is conventionally used as the deposition mask, in order to form a finer opening, a hybrid-type deposition mask tends to be used nowadays. The hybrid-type deposition mask is formed of a resin film, and a part of the resin film, excluding the peripheral edge of the opening, is supported by a metal support film. The deposition mask with a small amount of magnetic material, such as the hybrid mask, cannot sufficiently exhibit attraction unless it is under a stronger magnetizing field (magnetic field).

As mentioned above, with insufficient attraction, the accessibility between the substrate for vapor deposition and the deposition mask would be degraded. A strong magnetizing field is required in order to sufficiently close the deposition mask to the substrate for vapor deposition. When a permanent magnet is used as the magnet of the magnetic chuck, if its magnetizing field is strong, it is difficult to align the substrate for vapor deposition and the deposition mask. Meanwhile, when an electromagnet is used, the magnetic field is almost set to zero by turning off the application of current to a coil of the electromagnet, whereas the magnetic field can be generated and used for attraction by the application of current. Thus, at the time of alignment, the magnetic field is not applied, and after alignment, the magnetizing field can be applied, which facilitates the alignment between the substrate for vapor deposition and the deposition mask.

However, to generate a large magnetizing field using the electromagnet, it is necessary to increase the current. The strength of the magnetic field of the electromagnet is proportional to the product of the number of turns of the coil of the electromagnet and the current flowing through the coil. For this reason, to increase a magnetic field, it is necessary to raise the current or the number of turns. With either method, the amount of heat generation is increased. An electrical wire having a small resistance is originally used for the coil of the electromagnet because a large current is allowed to flow through the coil of the electromagnet. Consequently, the electromagnet generates heat due to a resistance loss of the current. Further, when a core (iron core) is used for the electromagnet, the generated magnetic field can be increased, but heat is generated by an eddy current. Therefore, when the current is further increased in order to increase the generated magnetic field, the heat generation becomes more problematic.

Meanwhile, once heat generation occurs, the heat is transferred to the substrate for vapor deposition and the deposition mask, thus increasing their temperatures. The substrate for vapor deposition and the deposition mask are made of different materials and hence have different coefficients of linear expansion. For example, when a difference in the coefficient of linear expansion between the substrate for vapor deposition and the deposition mask is 3 ppm/° C., a difference in edge-to-edge size of them having 1 m length is 3 μm per degree Celsius (centigrade) in temperature. For example, assuming that the size of one pixel is 60 μm on one side (60 μm square), it is considered that only a pixel displacement to about 15% is allowed at a resolution of 5.6 k. Thus, the pixel displacement is limited to 9 μm. In the above-mentioned example, a temperature increase of 1° C. leads to a difference in size of 3 μm, and therefore the temperature increase is limited to 3° C. That is, the temperature increase in each of the substrate for vapor deposition and the deposition mask because of a temperature increase of the electromagnet needs to be suppressed to 3° C. or less. Meanwhile, as the electromagnet is disposed in a vacuum chamber, it is difficult to radiate heat by air blowing or convection. It can be considered that the electromagnet is water-cooled by winding a metal pipe around it and causing a coolant to flow through the pipe. However, the heat dissipation through the coolant is time-consuming, so that a large amount of heat generated cannot be sufficiently dissipated in a short time. In addition, if a joint is broken, there is a risk that a large amount of water overflows into a vacuum chamber, potentially causing damage to the vacuum chamber.

The present invention has been made to solve these problems, and it is an object of the present invention to provide a vapor deposition apparatus and a vapor deposition method which can easily perform alignment between a substrate for vapor deposition and a deposition mask and attachment and detachment of the substrate for vapor deposition while surely and quickly cooling an electromagnet that generates heat, or suppressing the generated heat.

It is another object of the present invention to provide a method of manufacturing an organic EL display apparatus which exhibits excellent display quality by using the above-mentioned vapor deposition method.

Means to Solve the Problem

A vapor deposition apparatus according to a first embodiment of the present invention comprises: a vacuum chamber; a mask holder for holding a deposition mask disposed within the vacuum chamber; a substrate holder for holding a substrate for vapor deposition in contact with the deposition mask held by the mask holder; an electromagnet disposed on a surface, opposite to the deposition mask, of the substrate for vapor deposition held by the substrate holder; a vapor deposition source provided facing the deposition mask to vaporize or sublimate a vapor deposition material; and a heat pipe including at least a heat absorption part at a first end part thereof and a heat dissipation part at a second end part thereof opposite to the first end part, the heat absorption part being provided in contact with the electromagnet, and the heat dissipation part being derived to an outside of the vacuum chamber, wherein the heat pipe and the electromagnet are configured to be joined together in intimate contact with each other at an area of a contact part between the heat pipe and the electromagnet, the area being equal to or more than a cross-sectional area within an inner perimeter of a coil of the electromagnet.

A vapor deposition method according to a second embodiment of the present invention comprises: a step of superimposing an electromagnet, a substrate for vapor deposition, and a deposition mask having a magnetic material, and attracting the deposition mask to the substrate for vapor deposition by energization of the electromagnet; and a step of depositing a vapor deposition material on the substrate for vapor deposition by vaporizing or sublimating the vapor deposition material from a vapor deposition source disposed separately from the deposition mask, wherein the vapor deposition material is deposited while cooling the electromagnet by using a heat pipe in intimate contact with the electromagnet at an area wider than a cross-sectional area within an inner perimeter of a coil of the electromagnet.

A method of manufacturing an organic EL display apparatus according to a third embodiment of the present invention comprises: forming a support substrate having at least a TFT and a first electrode; forming an organic deposition layer by depositing organic materials on the support substrate using the vapor deposition method mentioned above; and forming a second electrode on the organic deposition layer.

Effects of the Invention

The vapor deposition apparatus and the vapor deposition method according to the first and second embodiments of the present invention suppress the temperature increase of the substrate for vapor deposition and the deposition mask due to the heat generation in the electromagnet. Thus, the misalignment between the deposition mask and the substrate for vapor deposition due to thermal expansion is suppressed. As a result, the accuracy of the vapor deposition of the organic layers is improved, so that the vapor deposition with an accurate pattern can be performed. By applying these vapor deposition apparatus and the vapor deposition method to the manufacturing of the organic EL display apparatus, the display apparatus with high definition can be obtained through forming fine pixels.

EMBODIMENT FOR CARRYING OUT THE INVENTION

Figure 1:
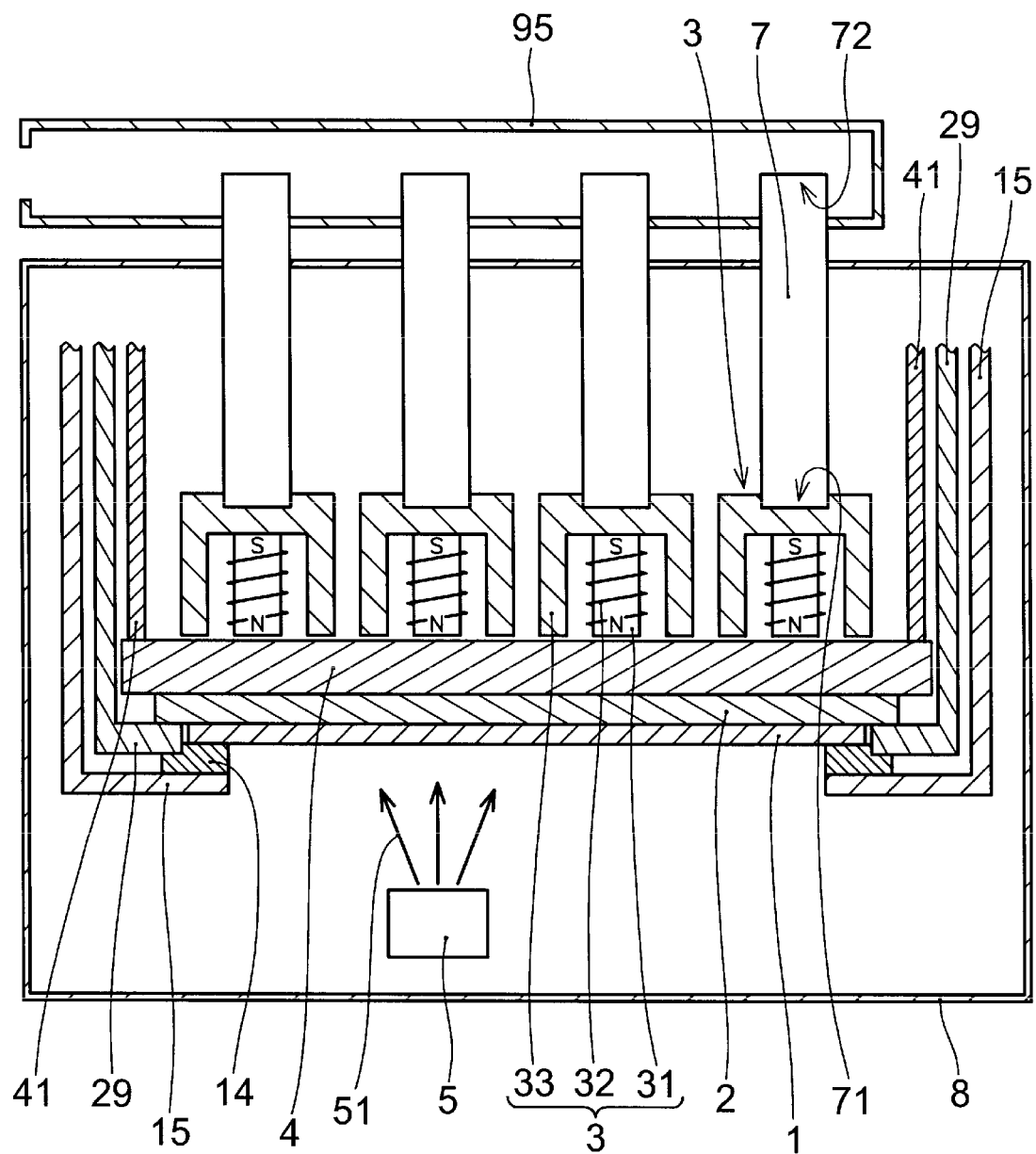
FIG. 1 is a diagram schematically showing a vapor deposition apparatus according to an embodiment of the present invention.

Hereinafter, vapor deposition apparatuses and vapor deposition methods according to first and second embodiments of the present invention will be described with reference to the accompanying drawings. As illustrated in FIG. 1, the vapor deposition apparatus of the present embodiment includes: a vacuum chamber 8; a mask holder 15 for holding a deposition mask 1 disposed in the vacuum chamber 8; a substrate holder 29 for holding a substrate for vapor deposition 2 in contact with the deposition mask 1 held by the mask holder 15; electromagnets 3 disposed above a surface, opposite to the deposition mask 1, of the substrate for vapor deposition 2 held by the substrate holder 29; a vapor deposition source 5 provided facing the deposition mask 1 to vaporize or sublimate a vapor deposition material 51; and heat pipes 7, each including at least a heat absorption part 71 at a first end part thereof and a heat dissipation part 72 at a second end part thereof opposite to the first end part, the heat absorption part 71 being provided in contact with the corresponding electromagnet 3, the heat dissipation part 72 being derived to the outside of the vacuum chamber 8. The heat pipe 7 and the electromagnet 3 are joined together in intimate contact with each other at an area of a contact part between the heat pipe and the electromagnet that is equal to or more than a cross-sectional area within an inner perimeter of a coil 32 in the electromagnet 3. It should be noted that in FIG. 1, reference numeral 4 denotes a touch plate that cools the substrate for vapor deposition 2 and prevents deformation of the substrate for vapor deposition 2.

The electromagnet 3 as used herein means one in which the magnetic field is generated by energizing the coil 32 and lost by turning off the energization. In a case where the electromagnet 3 includes a core (magnetic core or iron core) 31 inside the coil 32, the term electromagnet 3 also implies the core 31. In a case where a yoke 33 is further attached to the core 31, the term electromagnet 3 also implies the yoke 33. In a case where the coil 32, the core 31, and the like are integrated with a covering member 34 (see FIG. 3), such as a resin, the term electromagnet 3 also implies the covering member 34. The heat absorption part 71 of the heat pipe 7 refers to a contact part between the heat pipe 7 and the electromagnet 3.

As shown in FIG. 1, the schematic structure of the vapor deposition apparatus adopts a magnetic chuck method to be described later, in which the deposition mask 1 and the substrate for vapor deposition 2 are arranged vertically (or horizontally) and side by side, and a magnet 3 is disposed above the surface of the substrate for vapor deposition 2 opposite to the deposition mask 1 in order to obtain the intimate contact (good accessibility) between the deposition mask 1 and the substrate for vapor deposition 2, whereby the deposition mask 1 is attracted by the magnetic field of the magnet. In this case, a strong magnetic field strongly attracts the deposition mask. However, when a permanent magnet is used as this magnet, the strong magnetic field acts at the time of alignment between the deposition mask 1 and the substrate for vapor deposition 2. Thus, the deposition mask 1 and the substrate for vapor deposition 2 are constantly attracted strongly together when they are placed close to each other. Consequently, there arises a problem that it is difficult to perform precise alignment between the substrate for vapor deposition 2 and the deposition mask 1.

Meanwhile, when the electromagnet 3 is used as the magnet, the alignment can be performed in a state where no magnetic field is generated by turning off the current of the electromagnet 3 at the time of the alignment. As a result, the alignment can be performed easily. However, when a current flows through the electromagnet 3 to generate a magnetic field after the alignment, there arises a problem that the electromagnet 3 generates heat. That is, the magnetic field generated by the electromagnet 3 is proportional to the product of n and I (n·I) of the number of turns n of the coil 32 in the electromagnet 3 and the current I flowing through the coil 32. Thus, to attract the deposition mask 1 by a sufficient magnetic field, it is necessary to increase the current I or increase the number of turns n of the coil 32. When the number of turns n of the coil 32 is increased, the electrical wire is made longer, and thereby an electric resistance R is increased. That is, the Joule heat $I^2 \cdot R$ will increase, even if either the current I or the number of turns n of the coil 32 is increased. Thus, the stronger the magnetic field, the more serious the problem of heat generation becomes.

For example, in the case of vapor deposition using a 1 m square (1 m×1 m) deposition mask 1, to sufficiently attract the deposition mask 1, it is preferable to adopt a structure in which small electromagnets 3 (each being hereinafter referred to as a unit electromagnet 3) are arranged side by side as shown in FIG. 1, in terms of the uniformity of magnetic force distribution and the ease of heat dissipation. In this case, for example, about 25 unit electromagnets 3, each unit having a core 31 of 20 cm square, are arranged to cover the above-mentioned deposition mask 1. In one unit electromagnet 3, an electrical wire having a length of about 100 m is wound around the core 31. When a copper wire (resistivity: $1.72 \times 10^{-8}$ as $\Omega \cdot m$) having a diameter of about 1 mm is used as the electrical wire (resistivity: $2.78 \times 10^{-8}$ $\Omega \cdot m$ when a relatively inexpensive aluminum wire is used), the resistance R of the electrical wire is about 2.2$\Omega$ in the length 100 m.

When a current per unit electromagnet 3 is 2 A, the amount of heat generated is $I^2 \cdot R = 8.8$ W. The deposition time for one substrate for vapor deposition 2 (energization time) is about 120 seconds, but when the unit electromagnet 3 is continuously operated for 2 minutes, for example, an amount of heat of 8.8 W×120 s=1056 J (Joules) is generated. This corresponds to 252 calories, leading to a temperature increase of about 15° C. Since 25 unit electromagnets 3 are provided, the amount of heat generated is 6300 cal. Meanwhile, the volume (area) of the whole electromagnets 3 becomes larger, so that the temperatures of the whole electromagnets 3 are not 25 times higher than that of one unit electromagnet 3. However, there is a mutual thermal action between the adjacent unit electromagnets 3, and further the temperature of the whole electromagnets 3 may also vary depending on the heat capacity of the surroundings thereof, and the like, such as the presence or absence of the covering member 34. In addition, the vapor deposition is continuously performed by replacing the substrate for vapor deposition 2 in practice. Consequently, as the electromagnets 3 are further heated before being completely cooled, the heat is accumulated in the electromagnets 3, leading to a further increase in temperature of the whole electromagnet 3. In consideration of these factors, the temperature of the whole electromagnets 3 is thought to increase up to a maximum of about 20° C. A temperature increase of the deposition mask 1 and the like due to the temperature increase of the electromagnets 3 may vary depending on various conditions. When the temperature increase of the electromagnet 3 is about 20° C., the temperature of each of the substrate for vapor deposition 2 and the deposition mask 1 is considered to increase by about 12° C.

On the other hand, when the temperatures of the substrate for vapor deposition 2 or the deposition mask 1 increase, thermal expansion occurs. However, the substrate for vapor deposition 2 and the deposition mask 1 are made of different materials and hence differ from each other in thermal expansion. For example, even if the substrate for vapor deposition 2 is made of glass, and invar having a small expansion is used in a metal support film 12 (see FIG. 9) of the deposition mask 1, a difference in the coefficient of linear expansion between the substrate for vapor deposition 2 and the deposition mask 1 is about 3 ppm/° C. When a difference in coefficient of linear expansion between the substrate for vapor deposition 2 and the deposition mask 1 is 3 ppm/° C., a difference between one end and the other end of them 3 μm between the substrate for vapor deposition and the deposition mask, when the display panel has a length of 1 m. With an increase in size of the display apparatus and an increase in definition, such as 4 k or 8 k, it is considered that the pixel displacement is limited to about 15% at a resolution of 5.6 k, for example. In the above-mentioned large-sized screen having one side of about 1 m, the size of each pixel is about 60 μm on one side, and the pixel displacement of 15% corresponds to 9 μm. That is, a temperature increase of 3° C. is a limit for obtaining a high-definition image. As the temperature increase due to the heat radiation from the vapor deposition source 5 can be considered, the temperature increase due to the electromagnets 3 must be avoided as much as possible. In short, the present inventors have found that the temperature increase of the deposition mask 1 due to the electromagnets 3 must be suppressed to 10° C. or less at worst (when the resolution is low), preferably 5° C. or less, and more preferably 3° C. or less.

The size of the display panel is 1 m on one side in the above example, but generally, if one side of the display panel and one side of one pixel are proportional relation if the resolution is the same. Therefore the sizes of these sides vary almost proportionally to each other. For example, if one side of 50 cm in the display panel is intended to have the same resolution (in the above example, the resolution of 5.6 k) as one pixel, the length of one side of one pixel is 30 μm. Therefore, a pixel displacement of 4.5 μm (15%) is allowed for the length of 50 cm. That is, as this shows that 4.5 μm/50 cm=9 ppm, when a difference in coefficient of linear expansion is 3 ppm/° C., the temperature increase up to 3° C. is allowed. In short, this relationship can be applied to any sized display apparatus as long as the resolution is the same and the allowable ratio of pixel displacement is the same. However, unless the resolution is required to be so high, for example, at the same level of resolution as that of a current television, the pixel displacement up to about 40% is considered to be allowable. Therefore, the pixel displacement of about 25 μm is allowable for the panel of 1 m in length. That is, the present inventors have found that the heat dissipation from the electromagnet 3 needs to be done such that the temperature increase of the deposition mask 1 due to the thermal conduction from the electromagnets 3, which depends on the definition of the display panel, is 2° C. or less when the definition of about 8 k is required, 5° C. or less at a definition of about 4 k, and about 10° C. or less even at a definition of a normal television or the like.

From that point of view, the present inventors have conceived of employing the heat pipe 7 because the cooling of the electromagnets 3 by water cooling is insufficient, and the heat radiation cannot be performed on the inside of the vacuum chamber 8 by blowing air or convection. In this case, the heat pipe 7 can sufficiently cool its environment at the ambient temperature, but in the vacuum vapor deposition apparatus, as shown in FIG. 1, the electromagnets 3, the substrate for vapor deposition 2, and the deposition mask 1 are disposed very close to each other. As such, it is preferable to provide the heat pipe 7 in the vicinity of a surface of the electromagnet 3 facing the substrate for vapor deposition 2, but there is no space for arranging the heat pipe 7 having a normal rod shape. On the other hand, according to the heat pipe 7, the heat dissipation part 72 (see FIG. 1) is arranged outside the vacuum chamber 8, thereby making it possible to discharge heat generated by the electromagnet 3 to the outside of the vacuum chamber 8. Thus, a temperature increase inside the vacuum chamber 8 can be efficiently suppressed. Accordingly, the use of the heat pipe 7 is preferable.

Supposing that a space is provided for inserting the rod-shaped heat pipe 7, the distance between the electromagnet 3 and the deposition mask 1 is increased. As a result, the magnetic field in the deposition mask 1 is weakened, and thereby the attractive force is reduced. To secure the magnetic attraction force, it is necessary to further increase the magnetic field of the electromagnet 3, which requires increasing the current, and consequently, heat is further generated. Therefore, if the heat pipe 7 is disposed away from the surface of the electromagnet 3 facing the substrate for vapor deposition 2, almost all of the heat generated from the electromagnets 3 needs to be absorbed. Thus, the present inventors have found that how to dispose the heat pipe 7 becomes a very important issue when the heat pipe 7 is provided.

In order to solve such a problem, the present inventors have found, as a result of intensive studies, that the temperature of an end surface of the electromagnet 3 facing the deposition mask 1 can be decreased by bringing the heat pipe 7 into contact with the electromagnet 3 across a wide area, even on a surface of the electromagnet 3 opposite to the surface thereof facing the deposition mask 1. Specifically, the present inventors have found that the heat absorption part 71 of the heat pipe 7 and the electromagnet 3 are brought into contact (intimate contact) with each other at an area that is larger than at least a cross-sectional area within the inner perimeter of the coil 32 in the electromagnet 3. Thus, the temperature of the electromagnet 3 itself can decrease and the temperature increase of the deposition mask 1 can be suppressed.

In other words, in particular, it is important to cool parts of the coil 32 and the core 31 which generate heat, and it is effective to contact the heat absorption part 71 of the heat pipe 7 with the heat generating parts. That is, as mentioned above, for the purpose of preventing the temperature increase of the substrate for vapor deposition 2 and the deposition mask 1, it is preferable to decrease the temperature of the end surface of the electromagnet 3 facing the deposition mask 1. However, if there is no appropriate cooling means, it is necessary to reduce the temperature of the electromagnet 3 itself. In this case, as the temperature of the coil 32 and the core 31 rises the most, it is important to decrease the temperature of these parts. Therefore, the heat absorption part 71 of the heat pipe 7 needs to be in contact with the core 31 or the coil 32 of the electromagnet 3 over an area that is as wide as possible. That is, considering that the coil 32 is wound around the outer perimeter of the core 31, the heat absorption part 71 of the heat pipe 7 is preferably in contact with the core 31 or the core 32 of the electromagnet, further at least the entire surface of the end surface of the core 31 and further the cross-sectional area or more within the outer perimeter of the coil 32.

The reason why the heat absorption part of the heat pipe is in contact with the electro magnet at the cross-sectional area within the inner perimeter of the coil 32 or at a larger area than this cross-sectional area is based on the fact that in order to obtain a strong magnetic field, the electromagnet 3 is usually provided with the core (magnetic core) 31, and the coil 32 is wound around the core 31. Therefore, the cross-sectional area within the inner perimeter of the coil 32 is substantially equal to the cross-sectional area of the core 31. On the other hand, the heat generation of the electromagnet 3 includes heat generation of the coil 32 caused by the resistance loss of the coil 32, and heat generation caused by the resistance loss due to the eddy current generated in the core 31 when the core 31 is provided. As the coil 32 is generally wound around the core 31, the coil 32 and the core 31 are in intimate contact with each other, so that the heat generated in the coil 32 is easily transferred to the core 31. For this reason, the present inventors have found that the generated heat can be efficiently dissipated by bringing the heat pipe 7 into contact with at least the entire end surface of the core 31 to cool the core 31. Further, also in consideration of the contact with the coil 32 generating heat, the contact area between the heat absorption part 71 of the heat pipe 7 and the electromagnet 3 is preferably equal to or larger than the cross-sectional area within the outer perimeter of the coil 32. To enlarge the contact area, a part of the heat absorption part 71 of the heat pipe 7 is preferably embedded in the core 31. However when the core 31 is excessively shaved, the magnetic field is weakened.

Figure 3:
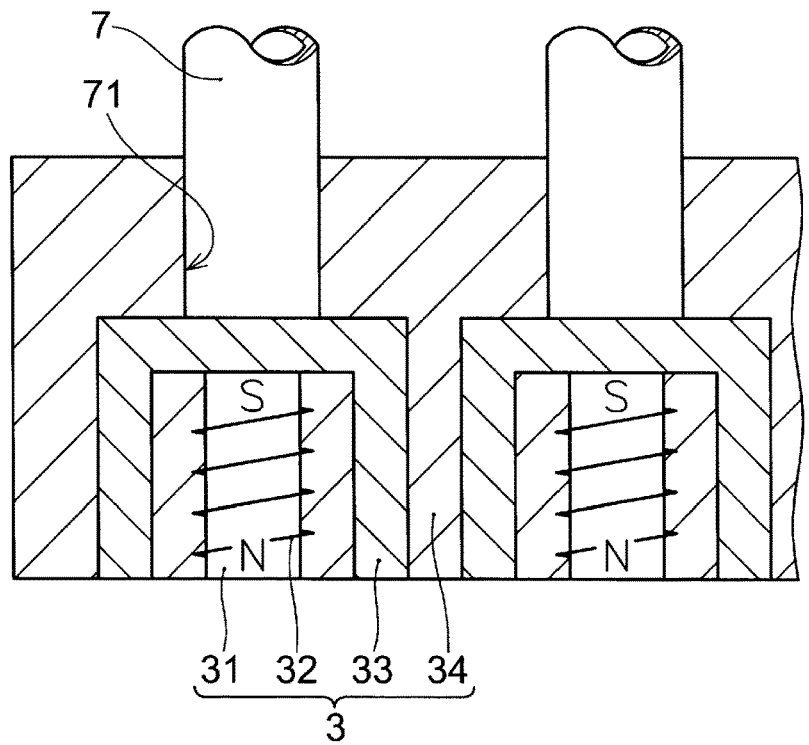
FIG. 3 is a diagram showing another example of a joint between an electromagnet and the heat pipe.

Meanwhile, the electromagnet 3 includes not only the coil 32 and the core 31 as described above, but also the yoke 33, when the yoke 33 is connected, for example, as shown in FIG. 1. Further, as shown in FIG. 3, when the core 31, the coil 32, the yoke 33, and the like are integrated together by the covering member 34, such as resin, the covering member 34 and the like can also be regarded as a part of the electromagnet 3. Therefore, when the yoke 33 is connected as shown in FIG. 1, the width of the yoke 33 is formed to be larger than the diameter of the core 31, so that the contact area can be increased without embedding a part of the heat absorption part 71 in the yoke 33 as shown in FIG. 1.

In addition, the coil 32, the core 31, and the like may be integrated together by the covering member 34, such as a resin (see FIG. 3), and the heat absorption part 71 of the heat pipe 7 may be embedded in the covering member 34. Further, a part of the heat absorption part 71 of the heat pipe 7 may be embedded in the core 31 or the yoke 33 (see FIGS. 1 and 4). Alternatively, the heat absorption part 71 of each heat pipe 7 is formed in a slender and elongated manner, so that the heat absorption parts 71 can be inserted deeply in the core 31 with little influence on the formation of a magnetic field (see FIGS. 5A and 5B). Furthermore, a heat absorption part 71 of the heat pipe 7 may be formed into a plate shape (flat shape) and then formed into a ring shape. The heat absorption part 71 of such a ring-shaped heat pipe 7 may be embedded in the core 31 (FIG. 6D). Moreover, as shown in Thermal Science & Engineering, pages 41-56, vol. 2, No. 3 (2015), a planar heat absorption part 71 of a loop-type heat pipe 7 may be provided on the end surface of the whole electromagnet 3 facing to the deposition mask 1 (FIGS. 7A to 7D). In this case, only a plate-shaped heat absorption part 71 can be provided in place of a touch plate 4 (see FIG. 1). That is, the plate-shaped heat absorption part 71 of the loop-type heat pipe 7 can only cool the deposition mask, but also suppress the warpage of the substrate for vapor deposition 2.

The core 31 is made of iron or the like, and its thermal conduction is not so good. Because of this, it is preferable that a coating layer 31b made of a material having a high thermal conductivity, such as copper, is formed on the surface of the core 31, at least in the vicinity of a contact part of the electromagnet with the heat pipe 7. By bringing the heat pipe 7 into intimate contact with the electromagnet 3 at an area that is as wide as possible, the heat generated by the electromagnets 3 can be efficiently discharged to the outside of the vacuum chamber 8. A method of increasing the contact area between the electromagnet 3 and the heat pipe 7 will be described later.

(Structure of Heat Pipe)

Figure 2A:
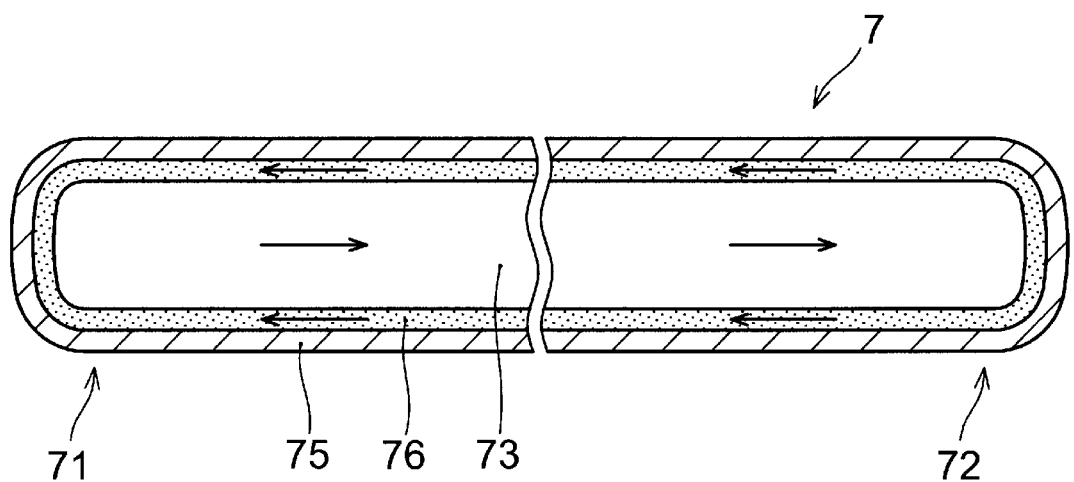
FIG. 2A is a diagram for explaining a structural example of a heat pipe shown in FIG. 1.

As a typical example, the heat pipe 7 has a structure as shown in FIG. 2A. That is, a wick 76 for moving a liquid by capillary action is formed on an inner wall of a vacuum-sealed pipe (case; container) 75 made of, for example, copper or the like, whereby a vacuum (low-pressure) structure is formed in which a small amount of an operating fluid (not shown) made of water or the like is sealed in the pipe 75. In this structure, when the heat absorption part 71, which is one end part, is heated by ambient heat, an operating fluid evaporates to generate vapor, thus increasing the internal pressure of the pipe 75. The vapor passes through a space 73 and is condensed and liquefied in the heat dissipation part (cooling part) 72, which is the other end part. The liquefied liquid travels toward the heat absorption part 71 by the capillary action in the wick 76 formed on the inner wall of the pipe 75. Owing to the latent heat transfer that accompanies such evaporation and the condensation, a large amount of heat is transported from the heat absorption part 71 to the heat dissipation part 72 even at a small temperature difference. The thermal conduction of the heat pipe 7 is said to reach even 100 times the thermal conduction of a round copper rod. The wick 76 may have any structure in which a liquid travels due to the capillary action, and may have a structure, such as a wire mesh, a porous body, a sponge, or the like.

As mentioned above, when the heat pipe 7 is disposed laterally, the condensed liquid is conveyed to the heat absorption part 71 through the wick 76. Meanwhile, for example, when the heat pipe 7 is arranged in the vertical direction, and on its lower side, the heat absorption part 71 is positioned (that is, a part of the heat pipe 7 having a high temperature is disposed on the lower side of the heat pipe 7), the liquid is evaporated on the lower side to form a vapor, and the vapor rises and is condensed in the heat dissipation part 72. In this case, even without the wick 76, the liquefied liquid falls under its own weight and returns to the heat absorption part 71. This is called a thermosiphon type. In the present embodiment, either type of heat pipe 7 can be used. For example, the wick 76 may be present when the heat pipe 7 is arranged in a vertical direction.

Figure 2B:
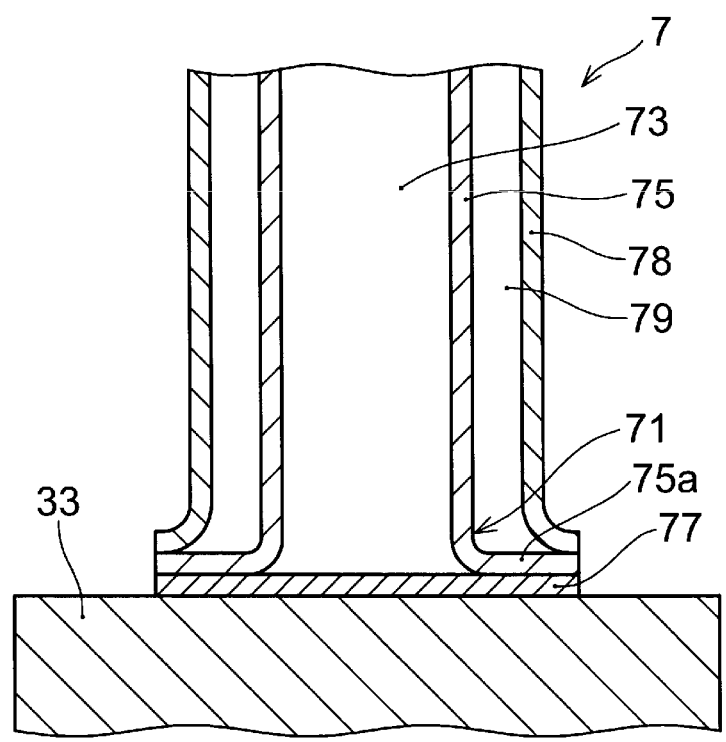
FIG. 2B is a diagram for explaining a modified example of the heat pipe shown in FIG. 1.

FIG. 2B is a diagram showing a heat pipe 7 as another structural example. The heat pipe 7 is sealed with an operating fluid, such as water. As described above, the heat pipe 7 is provided such that the heat absorption part 71 is in contact with the electromagnet 3. Thus, the heat pipe 7 is provided inside the vacuum chamber 8. If the heat pipe 7 is broken, the liquid sealed in its inside leaks into the inside of the vacuum chamber 8. If the liquid leaks into the vacuum chamber 8, the reliability and maintenance of the vacuum chamber become difficult to achieve.

A structure illustrated in FIG. 2B is to solve such a problem and is formed to have a double structure. That is, for example, an end of the heat absorption part 71 of a pipe 75 in the heat pipe 7 is configured of a closing plate 77 and a flange portion 75a, a protective pipe 78 is provided on the flange portion 75a by welding, brazing, or the like, and a space 79 is formed between the protective pipe 78 and the pipe (container) 75. This space 79 may be evacuated. With such a structure, even if the pipe (container) 75 is broken, the operating fluid does not leak into the vacuum chamber 8.

Figure 6A:
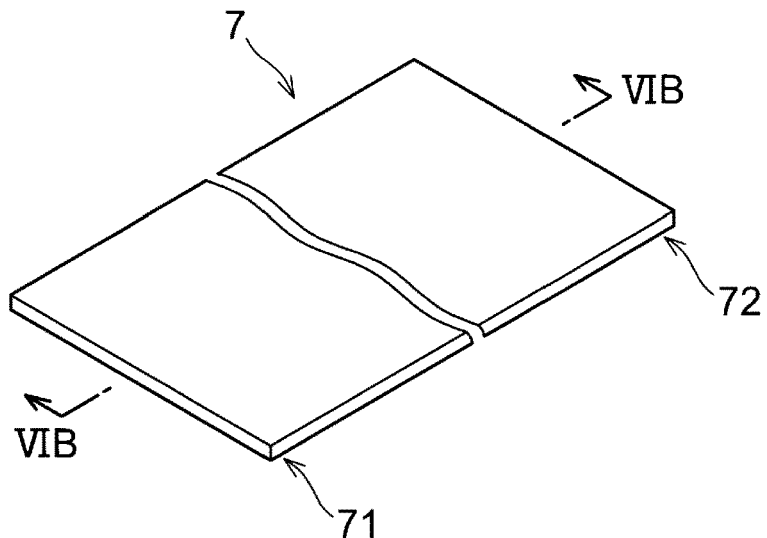
FIG. 6A is a plan view of a heat pipe showing a further example of a joint between the electromagnet and the heat pipe.
Figure 6B:
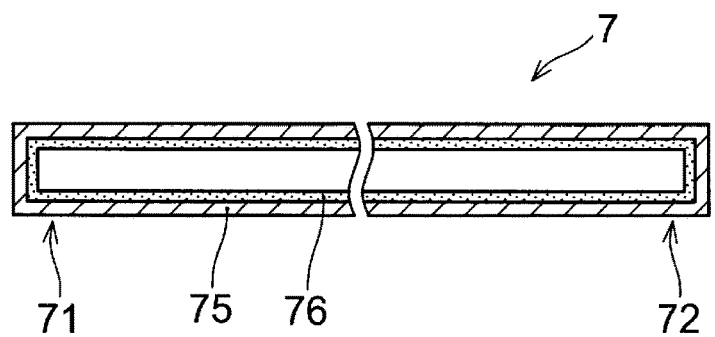
FIG. 6B is a cross-sectional view taken along line VIB-VIB of FIG. 6A.
Figure 7A:
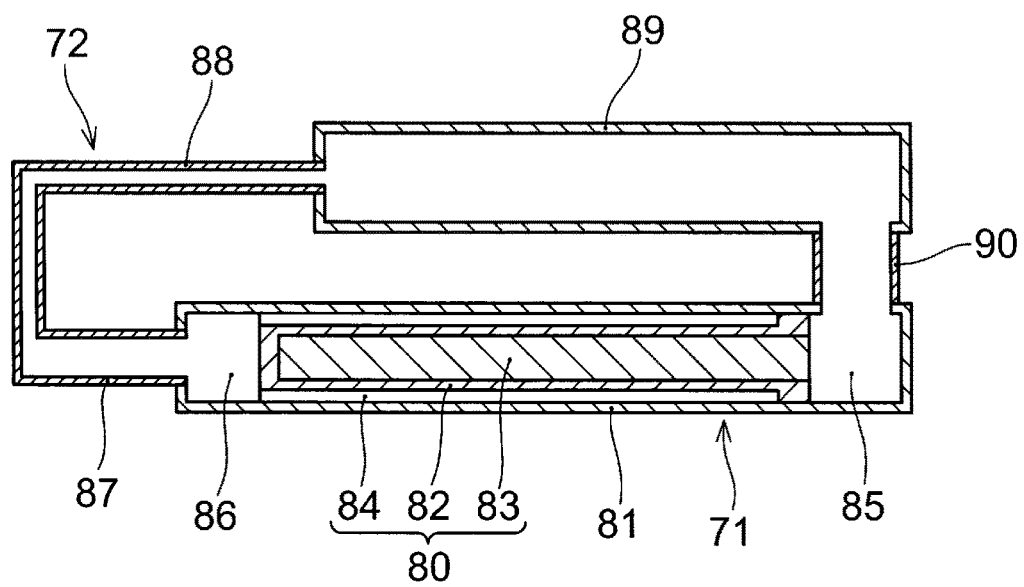
FIG. 7A is an explanatory diagram of a heat pipe for explaining a still further example of a joint between the electromagnet and the heat pipe.
Figure 7B:
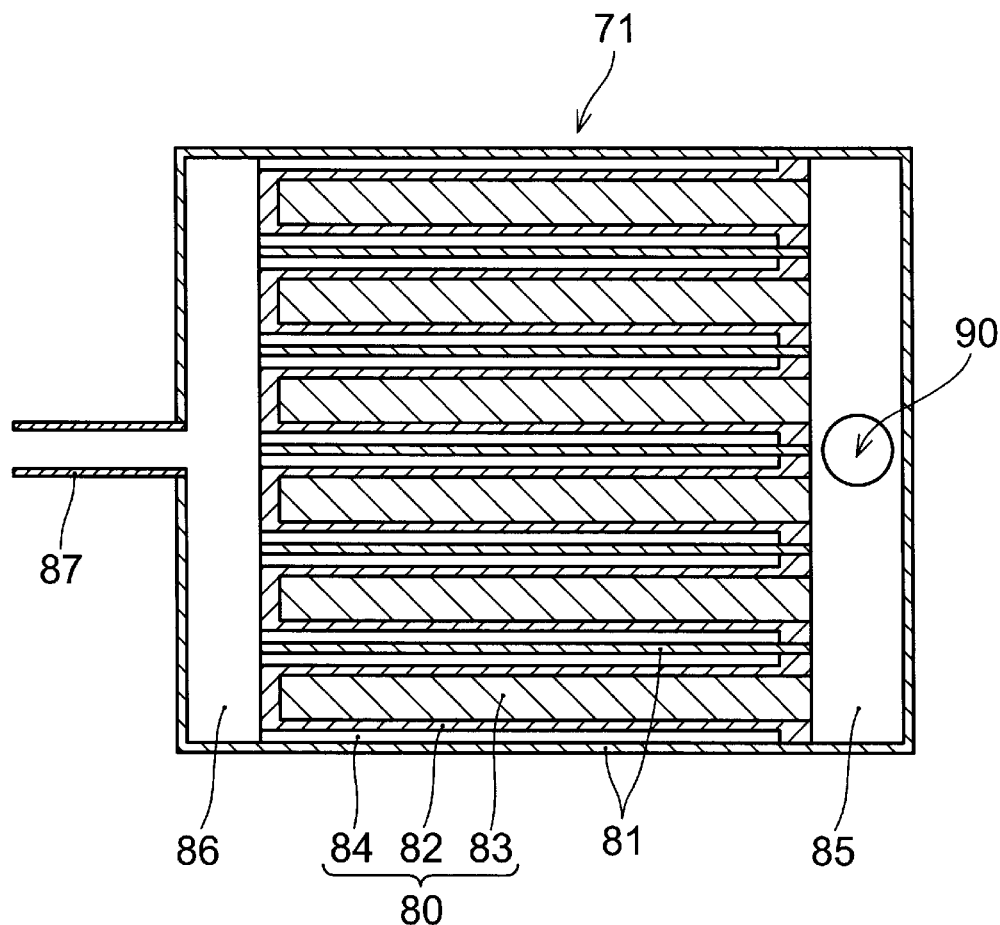
FIG. 7B is a plan view of a heat absorption part shown in FIG. 7A.
Figure 7C:
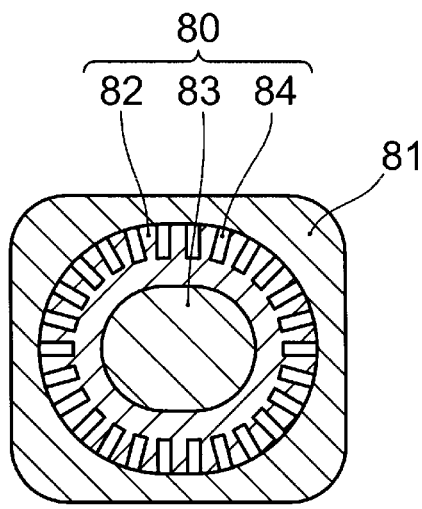
FIG. 7C is an explanatory diagram of a wick structure shown in FIG. 7B.

Further, the heat pipe 7 is not limited to the rod shape as shown in FIG. 2A, but may be formed in a flat shape (plate shape) as shown in FIGS. 6A and 6B described later. In this case, the pipe (container) 75 can also be formed of a thin metal plate, synthetic resin, or the like that can be subjected to a bending process, while having rigidity enough to hold the space 73. Further, for example, a loop-type heat pipe 7 as shown in FIGS. 7A to 7C to be described later can be used. Such a loop-type heat pipe 7 is formed to have a very thin flat-shaped (plate-shaped) heat absorption part 71 of, for example, about 10 mm in thickness. Thus, the loop-type heat pipe 7 can be disposed at the front surface of each electromagnet 3, i.e., at the end surface of the electromagnet 3, facing to the deposition mask 1. In this case, the touch plate 4 shown in FIG. 1 may be omitted and replaced with the heat absorption part 71 of the heat pipe 7. Consequently, the heat pipes 7 can be disposed with little influence on the attractive force of the electromagnets 3.

Next, a description will be given on an example in which the heat pipe 7 and the electromagnet 3 are in contact with each other at a larger area than the cross-sectional area within the inner perimeter of the coil 32.

First Example

In this first embodiment, as shown in FIG. 1, a unit electromagnet 3 is formed of a core 31, a coil 32 formed by winding an electrical wire around the core 31, and a yoke 33 having a C-shaped cross section and connected to an end part of the core 31 (an E-shaped yoke together with the core 31). For example, a heat pipe 7 shown in FIG. 1 is provided so as to be connected to a back surface of the yoke 33 (a surface opposite to the surface facing the deposition mask 1). When such a structure is adopted in which the heat pipe 7 is in contact with the yoke 33, the contact area between the electromagnet and the heat pipe can be made larger than the cross-sectional area within the inner perimeter of the coil 32 by enlarging the diameter of the heat pipe 7.

In an example shown in FIG. 1, the heat absorption part 71 of the heat pipe 7 is disposed to be embedded in the yoke 33. It is not essential that a part of the heat absorption part 71 of the heat pipe 7 is embedded in the yoke 33. If an area of an end surface of the heat pipe 7 is larger than the cross-sectional area within the inner perimeter of the coil 32, heat can be sufficiently dissipated. Nevertheless, as mentioned above, the larger the contact area between both the heat pipe and the electromagnet, the more preferable it is. That is, the electromagnet is in contact with the heat pipe 7 not only at an area of the end surface of the heat pipe 7, but also at an area of a peripheral surface of the embedded part of the heat pipe. With this structure, the heat dissipation effect of the electromagnet 3 is improved. Meanwhile, as the yoke 33 serves as a path for the magnetic field lines, if the heat absorption part 71 is embedded in the yoke 33 too deeply, the magnetic field lines are disturbed. However, such an influence can be suppressed by thickly forming the yoke 33 in advance.

Although not shown, a coating layer 31b (see FIG. 4) having a high thermal conductivity is formed by copper plating or the like on the surface of the core 31 or the surface of the yoke 33, thus further enhancing the heat dissipation effect. The heat pipe 7 has a thermal conductivity that is about 100 times higher than a thermal conductivity of copper, but as mentioned above, a space for effectively contacting the heat pipe 7 with the electromagnet 3 is limited. For this reason, it is preferable to improve the thermal conduction within the electromagnet 3 up to the heat pipe 7, which is arranged in a limited position.

The provision of the yoke 33 strengthens the magnetic field acting on the deposition mask 1. Since a magnetic pole of the electromagnet 3 on its surface opposite to the surface facing the deposition mask 1 comes close to the end surface facing the deposition mask 1 via the yoke 33, the magnetoresistance becomes smaller than that via the air, so that a strong magnetic field is obtained. Consequently, the current or the number of electromagnets 3 for obtaining the desired attractive force can be reduced, thereby further preventing the heat generation and suppressing the temperature increase of the deposition mask 1 or the like.

Second Example

In the configuration of a second example, as shown in FIG. 3, the coils 32, the cores 31, and the yokes 33 are integrally covered with a covering member 34 made of a heat-resistant resin or the like, such as epoxy resin. The material for the covering member 34 is not limited to this example, but is preferably a material that is less likely to generate gas because the covering member is disposed inside the vacuum chamber 8. For example, PEEK (polyether ether ketone) or the like can be used. In particular, a material having good thermal conductivity is preferable. A filler, such as metal powder, may be blended in the covering member as needed.

In the example shown in FIG. 3, the heat absorption part 71 of each heat pipe 7 is attached to be in contact with the surface of the yoke 33. Even in this structure, the heat absorption part 71 of the heat pipe 7 is embedded in the covering member 34, so that the side surface of the heat pipe 7 is also in contact with the electromagnet 3 (covering member 34 and yoke 33). Therefore, the contact area between the heat pipe 7 and the electromagnet 3 is sufficiently secured. In the example shown in FIG. 3, the heat pipe 7 is attached via the yoke 33, but the yoke 33 may not be provided. Even if the yoke 33 is not provided, the side surface of the heat absorption part 71 of the heat pipe 7 is in contact with the covering member 34, so that the contact area required for thermal conduction can be secured.

As shown in FIG. 3, by covering the cores 31 and the coils 32 of the electromagnets 3 with the covering member 34, the contact areas with the heat pipes 7 can be easily increased, and in addition, heat generated by the coils 32 can be directly transferred by the covering member 34. That is, the outer surface of the coil 32 has continuous mountain-shaped surfaces because its outer surface is formed by winding the electrical wire having a circular cross section. Thus, even if the heat pipe 7 is intended to be directly contacted with the coil, a sufficient contact area therebetween cannot be obtained. However, if the coils and heat pipes are covered with the covering member 34, such as resin, a gap between the wires of each coil 32 is filled with the covering member 34, whereby the contact with the coil 32 can be completely obtained. As a result, heat generated in each coil 32 can be transferred to the heat pipe 7 directly via the covering member 34 without interposing the core 31. Thus, the heat dissipation effect is improved significantly. In this case, it is considered that the heat generated in the coil 32 or the like is covered with the covering member 34, so that the heat is not directly radiated and is more likely to be held. However, as the electromagnets 3 are originally disposed inside the vacuum chamber 8, the heat dissipation by convection is hardly expected, and the heat dissipation effect due to conduction of the covering member 34 is thought to be larger than that exhibited by convection.

Third Example

Figure 4:
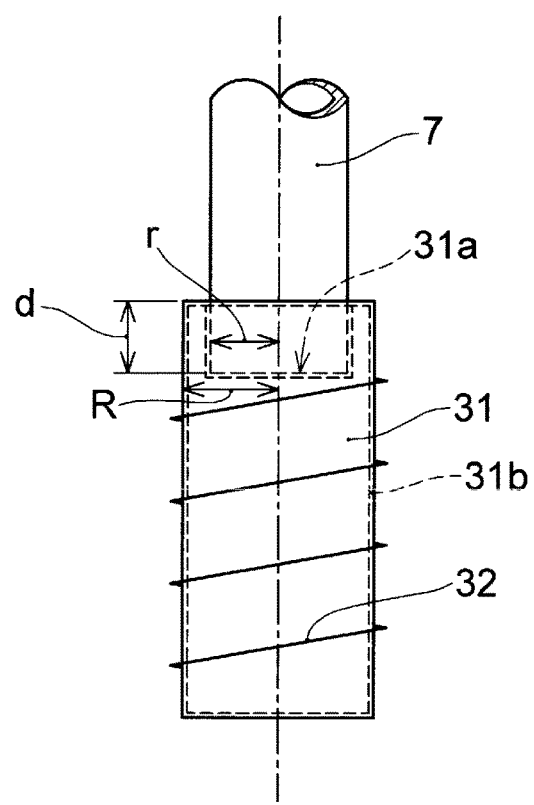
FIG. 4 is a diagram showing still another example of a joint between the electromagnet and the heat pipe.

FIG. 4 is a diagram showing a third example. In a structure of the third embodiment, a concave portion 31a corresponding to the thickness and shape of the heat pipe 7 is formed in one end part of the core 31, and the heat absorption part 71 of the heat pipe 7 is embedded in the concave portion 31a. With this structure, the area of an end part of the heat pipe 7 is smaller than the area within the outer perimeter of the core 31, that is, the inner perimeter of the coil 32. Nevertheless, as the heat absorption part 71 of the heat pipe 7 is embedded in the core 31, the side surface of the heat pipe 7 also has a contact area with the core, so that the contact area can be made larger than the cross-sectional area of the core 31.

A depth d of the concave portion 31a is preferably larger from the viewpoint of increasing the contact area. However, if the concave portion is too deep, the magnetoresistance of the magnetic field lines passing through the inside of the concave portion becomes large. Thus, as mentioned above, the concave portion is formed at the depth d that makes the contact area between the electromagnet 3 and the heat pipe 7 larger than the cross-sectional area of the core 31. Specifically, the contact area S1 between both the heat absorption part 71 and the core 31 is expressed by $S1=\pi r^2+2\pi rd$, and the cross-sectional area of the core 31, i.e., the cross-sectional area within an inner diameter of the coil 32 is expressed as $S2=\pi R^2$ where r is a radius of the end surface of the heat absorption part 71 of the heat pipe 7, and R is a radius of the cross-sectional area of the core 31. Therefore, to achieve $S1 \geq S2$, $(\pi r^2+2\pi rd) \geq \pi R^2$ is required. That is, it means $d \geq (R^2-r^2)/2r$.

Like the example shown in FIG. 1, also, in this case, it is preferable that especially the contact between the heat pipe 7 and the electromagnet 3 (core 31) is good. For this reason, bonding is preferably performed within the concave portion 31a using an adhesive having good thermal conductivity, soldering, brazing, or the like. Furthermore, it is important to transfer heat of the core 31 or the like to the heat pipe 7. Because of this, a coating layer 31b having good thermal conductivity, such as copper plating, is preferably formed. Such a formation of the coating layer 31b that has a larger thermal conductivity than the core 31 is not limited to the example shown in FIG. 4 and can be applied to other examples in the same manner. Even if the coating layer 31b is not formed over the entire surface of the core 31 or the like, the effect of the coating layer can be exhibited as long as this coating layer is formed in the vicinity of at least a jointed part with the heat pipe 7.

Fourth Example

Figure 5A:
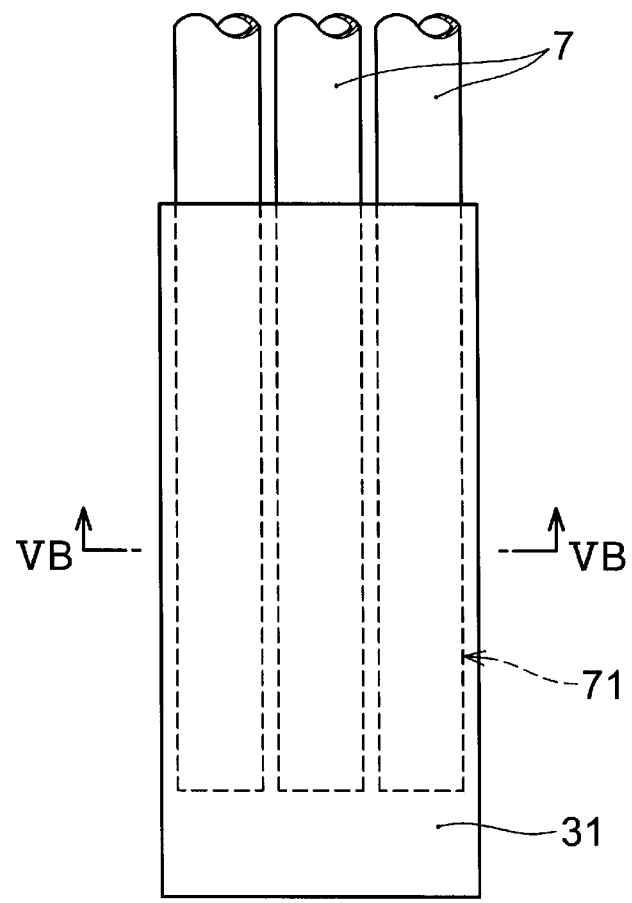
FIG. 5A is a diagram showing yet another example of a joint between the electromagnet and the heat pipe.
Figure 5B:
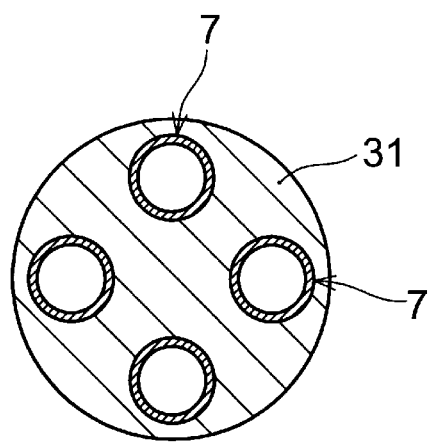
FIG. 5B is a cross-sectional view taken along line VB-VB of FIG. 5A.

FIGS. 5A and 5B are diagrams for explaining a fourth example. That is, FIG. 5A is a side view, and FIG. 5B is a cross-sectional view taken along the line VB-VB of FIG. 5A. In this example, the heat pipes 7 are slender and embedded in the cores 31. That is, if the cross-sectional area of the heat pipe 7 is reduced, the bad influence on the magnetic field lines is suppressed. Further, by lengthening the heat absorption part 71 of the heat pipe 7 and deeply embedding the heat absorption part in the core 31, the contact area between the heat pipe 7 and the core 31, i.e., electromagnet 3 can be sufficiently increased. Thus, the slender heat pipe 7 is embedded in the core 31, thereby the temperature of the core 31 can be efficiently decreased, while suppressing the influence on the magnetic field lines.

In a method of embedding the heat pipe 7 into the core 31, a hole having the same size as an outer diameter of the slender heat pipe 7 may be formed in the core 31, and the heat absorption part 71 of the heat pipe 7 may be inserted into and bonded to the hole with an adhesive having a large thermal conductivity, or may be bonded by soldering, brazing, or the like, as mentioned above. Further, after inserting the heat pipe 7 into the hole formed in the core 31, resin that contains fine particles having a large thermal conductivity, such as carbon nanotubes, may fill a gap between the heat pipe 7 and the core 31. In this way, the thermal conductivity from the core 31 to the heat pipe 7 is improved. In another method, sintering iron powder is placed in a molding die that has a concave portion with a desired shape of the core 31, and the heat pipe 7 is embedded in the molding die to pressurize the powder, followed by sintering. That is, the use of a so-called powder magnetic core forming method can also embed the heat pipe 7 in the core 31.

With this structure, the heat pipe 7 can be embedded to a sufficient depth into the core 31 with little influence on the magnetic field lines. That is, the contact area between the heat pipe 7 and the core 31 can be increased without reducing the cross-sectional area of the core 31 so much. Further, by inserting the heat pipe 7 deep into the core 31, the temperature of the surface of the electromagnet 3 facing the deposition mask 1 is more likely to be decreased. That is, as mentioned above, there is no space between the electromagnet 3 and the deposition mask 1, into which a normal rod-shaped heat pipe 7 is inserted, from the necessity to decrease an interval therebetween. Owing to this, the heat pipe 7 is inserted into or in contact with the core 31 from a surface opposite to the surface of the electromagnet 3 facing the deposition mask 1. Consequently, cooling of the core 31 is also performed from the surface opposite to the surface of the electromagnet 3 facing to the deposition mask 1. However, according to the present example, the heat pipe 7 can be positioned as close as possible to the surface of the core 31 facing to the deposition mask 1. The heat pipe 7 can also be exposed at the front surface of the electromagnet 3 (surface facing the deposition mask 1) through the core 31. In short, the surface of the electromagnet 3 facing the deposition mask 1, which should be cooled the most, can be efficiently cooled.

Fifth Example

FIGS. 6A to 6D are diagrams for explaining a fifth example. That is, in the fifth example, the heat pipe 7 is formed into a flat shape and then rolled and embedded in the core 31. As illustrated in a plan view of the heat pipe 7 of FIG. 6A and in a cross-sectional view taken along the line VIB-VIB of FIG. 6B, in the fifth embodiment, the heat pipe 7 is formed in a tubular cuboid shape with each side being flat (plate shaped). In addition, this cuboid shape has one end part serving as the heat absorption part 71 and the other end part as the heat dissipation part 72. The heat pipe 7 is different from the round bar shape shown in FIG. 2A, in that it has a flat shape, and is the same in that the wick 76 is formed on the inner surface of the container (pipe) 75 and has the same function. The wick 76 may not be provided as mentioned above as long as the heat absorption part 71 is formed on the vertically lower side and the heat dissipation part 72 is formed on the vertically upper side. The container 75 is formed of a flexible material, which does not deform even when its internal pressure is set to a low pressure. For example, a thin copper plate, a stainless steel plate, or the like having a thickness of about 0.1 to 0.5 mm can be used.

Figure 6C:
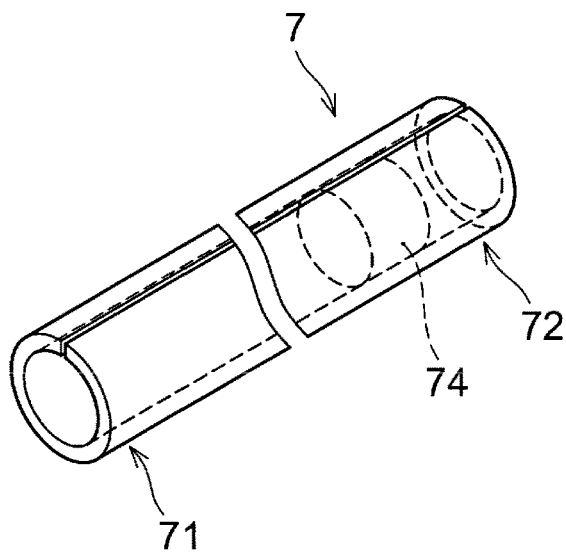
FIG. 6C is a perspective view of the rolled heat pipe of FIG. 6A.
Figure 6D:
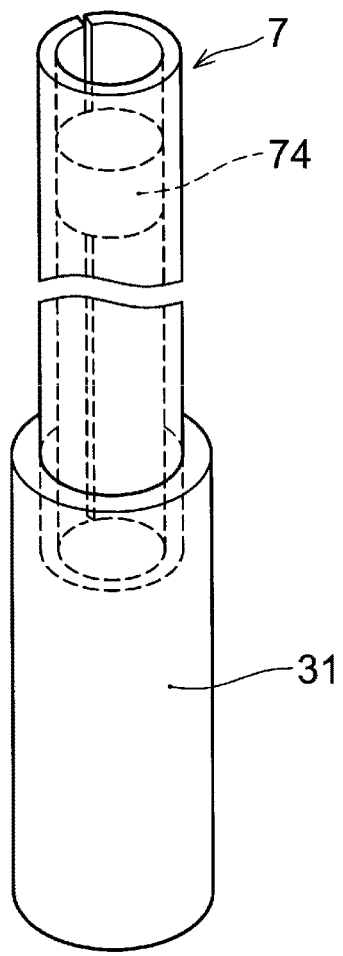
FIG. 6D is a diagram showing a state in which the heat pipe of FIG. 6C is embedded in the core.

The reason why the heat pipe has the flexibility is to roll the heat pipe as shown in a perspective view of FIG. 6C. By rolling the heat pipe as shown in FIG. 6C, a reduction in the cross-sectional area of the core 31 can be minimized even if the heat pipe is embedded in the core 31, as schematically shown in FIG. 6D. That is, the influence on the magnetic field can be minimized. In FIG. 6D, the heat pipe 7 is schematically shown to be inserted only into an upper part of the core 31. However, in practice, the heat pipe 7 can be inserted into a lower end part of the core 31 (or a front surface of the electromagnet 3) or up to the vicinity thereof. In FIG. 6C, the rolled shape does not need to be a precisely cylindrical shape, and may be a square shape or an indefinite shape. In addition, the rolled ends may be joined, but do not need to be joined with a gap therebetween. Reference numeral 74 denotes a sealing stopper made of copper or the like. As the heat dissipation part 72 is derived to the outside of the vacuum chamber 8, the heat dissipation part 72 is hermetically sealed such that the vacuum inside the vacuum chamber 8 can be maintained.

In order to embed such a heat pipe 7 in the core 31, like the above-mentioned fourth example, a groove is formed in the core 31, and the rolled heat pipe 7 is inserted into the groove, which can eliminate a gap from the heat pipe. However, when the shape of the rolled heat pipe 7 cannot be made constant, the configuration of the fifth example can be easily obtained by forming the core 31 using the above-described formation method of a powder magnetic core, which includes compressing and molding the magnetic powder.

In the above-described example, the heat pipe 7 having a flat cuboid shape is rolled into a ring shape, but the heat pipe does not need to be formed into the ring shape. For example, heat pipes are formed such that the heat pipe 7 shown in FIG. 6A is divided into a plurality of strip-shaped heat pipes, each having the heat absorption part 71 and the heat dissipation part 72. Each of the strip-shaped heat pipes may be configured to be individually embedded in the corresponding core 31. As such, the heat pipe 7 can be embedded in the core 31 at a small cross-sectional area along the shape of the core 31 without rolling the heat pipe 7. In this case, as the heat dissipation part 72 needs to be derived to the outside of the vacuum chamber 8, the use of a bellows to be described later is required for fixing the heat pipe 7 to the vacuum chamber 8. However, even when replacing the substrate for vapor deposition 2 (see FIG. 1) or the deposition mask 1 (see FIG. 1) as mentioned later, the heat pipe 7 (for example, a part in the vicinity of the heat dissipation part 72) can be directly fixed and attached to the vacuum chamber 8 by performing the replacement while fixing the electromagnet 3 (see FIG. 1).

According to this method, the heat pipe 7 is formed in a thin flat shape. Thus, even when the heat pipe 7 is embedded in the core 31, the cross-sectional area of the heat pipe 7 within the core 31 is small, and hence the influence on the magnetic field lines is very little. In addition, the influence on the magnetic field lines hardly changes depending on the embedded depth. Therefore, the heat pipe 7 can be embedded in the core 31 almost across its entire height. As a result, the temperature of the surface of the electromagnet 3 facing to the deposition mask 1 can be effectively decreased. That is, the heat pipe 7 works very effectively to cool the electromagnet 3.

Sixth Example

FIGS. 7A to 7D are explanatory diagrams for a sixth example. The sixth example has a structure similar to the loop-type heat pipe 7 described in Thermal Science & Engineering, pages 41-56, vol. 2, No. 3 (2015), mentioned above. FIG. 7A shows a side view of the loop-type heat pipe 7; FIG. 7B shows a plan explanatory view of the heat absorption part 71; and FIG. 7C shows a structural example of a wick structure 80. That is, as shown in FIG. 7B, multiple (six in the example shown in FIG. 7B) wick structures 80 are embedded in a case (container) 81 made of copper or the like. Each wick structure 80 has a wick core 83 at its center part, as FIG. 7C shows the cross-sectional structure, a wick 82 is formed in a gear-like shape around the wick core, and grooves 84 are formed between teeth of the wick 82 to provide a path for vapor.

The wick 82 can be formed to have the size of, for example, about 8 mm×9 mm, (the thickness of the heat absorption part 71 can be reduced by crushing it in the height direction into an oval shape). In this case, the groove 84 can be formed to have a depth of 1 mm and a width of about 0.5 mm. The wick 82 and the wick core 83 are made of, for example, a porous material, such as PTFE (polytetrafluoroethylene). Pores in this porous material can be formed with an average radius of about 5 μm and a porosity of about 35%. Such a wick 82 is formed integrally with the grooves 84, for example, by molding a powdery PTFE.

In FIGS. 7A and 7B, reference numeral 86 denotes a vapor collecting portion, 87 denotes a vapor pipe, 88 denotes a liquid pipe, 89 denotes a liquid reservoir tank, 90 denotes a connection pipe, and 85 denotes a liquid distributing portion. The basic operation of this device is the same as that of the heat pipe 7 shown in FIG. 2A described above, but in this device, liquid is sucked by the capillary action of each wick core 83 in the liquid distributing portion 85 to proceed from the wick core 83 to the capillary of the wick 82, and is evaporated by the heat from the case 81. The evaporated vapor proceeds to a vapor collecting portion 86 through spaces defined by the grooves 84. It should be noted that as shown in FIG. 7A, the grooves 84 are sealed by the wick 82 between the grooves 84 and the liquid distributing portion 85, while the groove 84 penetrates the vapor collecting portion 86. Thus, when the pressure in the groove 84 increases due to evaporation of the liquid, the vapor advances toward the vapor collecting portion 86. Then, the vapor is cooled in the heat dissipation part 72 through the vapor pipe 87 to be liquefied, and the resulting liquid is accumulated in the liquid reservoir tank 89 through the liquid pipe 88. The liquid stored in the liquid reservoir tank 89 returns to the liquid distributing portion 85 via the connection pipe 90 by gravity. As the vapor is liquefied in the heat dissipation part 72, the pressure in the case 81 decreases, and the liquid further evaporates in the heat absorption part (evaporating part) 71. The aforesaid processes are repeated. The heat absorption part (evaporating part) 71 is formed to have such a structure, thereby making it possible to cool the wide area.

Figure 7D:
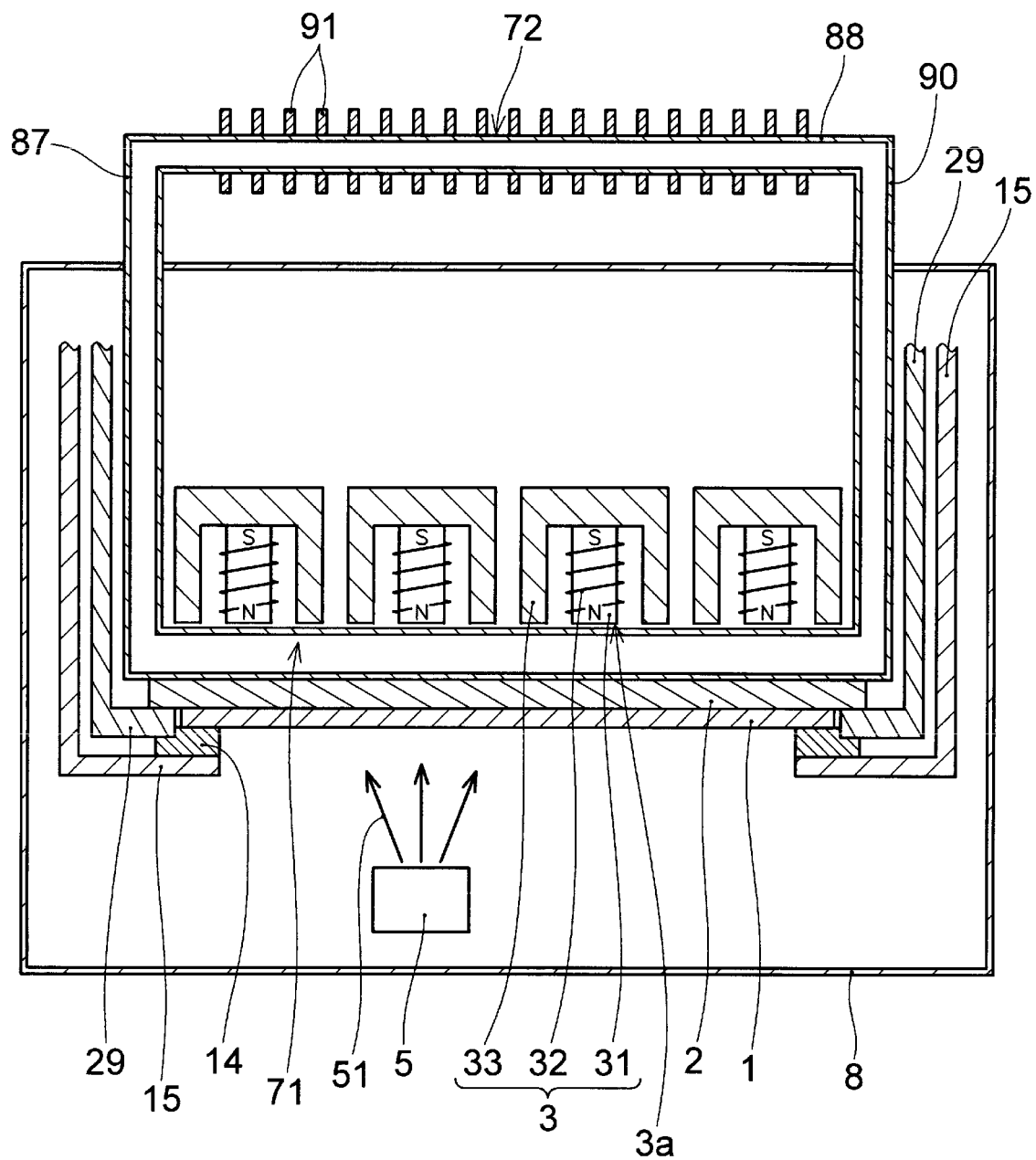
FIG. 7D is a schematic diagram showing a state in which the heat pipes shown in FIG. 7A are incorporated in a vapor deposition apparatus.

By using such a loop-type heat pipe 7, for example, as shown in FIG. 7D, the heat pipe 7 can be installed at the front surfaces 3a (surfaces facing to the deposition mask 1) of the electromagnets 3 as it is. In the example shown in FIG. 7D, the heat absorption part 71 of each heat pipe 7 is provided in place of the touch plate 4 of the vapor deposition apparatus shown in FIG. 1. However, the conventional touch plate 4 may be provided as it is, and the heat absorption part 71 of the loop-type heat pipe may be inserted between the touch plate 4 and the electromagnets 3. With such a structure, the surface 3a of each electromagnet 3 facing the deposition mask 1 is cooled, which is the most appropriate for suppressing the temperature increase of the deposition mask 1. In FIG. 7D, the same parts as those in FIG. 1 are denoted by the same reference numerals, and for the description of these parts, the following description with reference to FIG. 1 is used as a substitute. Reference numeral 91 denotes a heat dissipation plate. That is, the heat dissipation part 72 can be cooled by air cooling or the like.

In the loop-type heat pipe 7, the heat absorption part 71 is arranged horizontally and hence needs the wick 82 therein. However, the connection pipe 90 leading from the liquid reservoir tank 89 to the liquid distributing portion 85 is disposed vertically, thus causing the liquid to drop under its weight, even if the wick is not provided. As a result, the heat transfer is performed by circulation of the liquid and vapor between the evaporating part (heat absorption part 71) and the heat dissipation part 72. Thus, the temperature increase of the substrate for vapor deposition 2 and the deposition mask 1 can be efficiently suppressed.

(Schematic Structure of Vapor Deposition Apparatus)

As shown in FIG. 1 and described above, the vapor deposition apparatus according to one embodiment of the present invention is provided such that the mask holder 15 and the substrate holder 29 can be moved vertically to arrange the deposition mask 1 and the substrate for vapor deposition 2 close to each other within the vacuum chamber 8. The substrate holder 29 is connected to a driving unit (not shown) so as to hold the peripheral edges of the substrate for vapor deposition 2 with a plurality of hook-shaped arms and to ascend and descend vertically. In the case of replacing the substrate for vapor deposition 2 or the like, the substrate for vapor deposition 2 carried into the vacuum chamber 8 by robot arms is received by the hook-shaped arms, and the substrate holder 29 is descended until the substrate for vapor deposition 2 approaches the deposition mask 1. An image pickup device (not shown) is also provided for performing alignment. The touch plate 4 is supported by a support frame 41, and connected, via the support frame 41, to a driving unit that descends the touch plate 4 until the touch plate 4 comes into contact with the substrate for vapor deposition 2. By descending the touch plate 4, the substrate for vapor deposition 2 is planarized.

The vapor deposition apparatus also includes a fine adjuster that moves the substrate for vapor deposition 2 relative to the deposition mask 1 while imaging alignment marks respectively formed on the deposition mask 1 and the substrate for vapor deposition 2, when the deposition mask 1 of the present embodiment is aligned with the substrate for vapor deposition 2. In order not to unnecessarily attract the deposition mask 1 by the electromagnets 3, the alignment is performed in a state where the energization of the electromagnets 3 is stopped. Thereafter, the touch plate 4 and the electromagnet 3 held by a similar holder (not shown) are descended, and current is caused to flow, whereby the deposition mask 1 is attracted to the substrate for vapor deposition 2.

In the present embodiment, the heat pipe 7 is provided in intimate contact with the yoke 33 of the electromagnet 3. As mentioned above, the heat absorption part 71 of the heat pipe 7 is in intimate contact with the electromagnet 3 at the cross-sectional area within the inner diameter of the coil 32, preferably, at an area larger than the cross-sectional area thereof, and the heat dissipation part 72 at the other end is derived to the outside of the vacuum chamber 8. The heat dissipation part 72 is placed in, for example, a heat discharge tank 95 to enable cooling, such as air cooling or water cooling. In this way, the heat pipe 7 has the heat absorption part 71 at one end part thereof inside the vacuum chamber 8, and the heat dissipation part 72 at the other end part thereof outside the vacuum chamber 8. As described above, when replacing the substrate for vapor deposition 2 or the deposition mask 1, the electromagnet 3 or the like needs to be lifted upward and descended again after the replacement.

Figure 8:
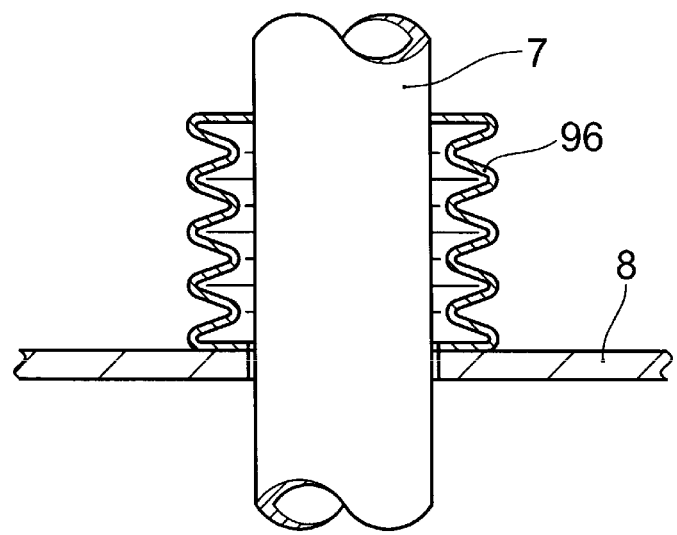
FIG. 8 is a diagram showing an example of a structure in which a heat pipe is connected to a vacuum chamber.

Because of this, the heat pipe 7 cannot be directly fixed to a wall surface of the vacuum chamber 8. In such a case, as shown in FIG. 8, the heat pipe 7 is preferably fixed to the vacuum chamber 8 via a bellows 96. The distance by which the electromagnets 3 and the like are lifted when replacing the substrate for vapor deposition 2 or the like is about 100 mm or less, and thus the bellows 96 may be one that can expand and contract to that extent.

However, while the electromagnet 3 and/or the touch plate 4 may have fixed structure, the deposition mask 1 and the substrate for vapor deposition 2 may be descended to replace the substrate for vapor deposition 2 or the like, and then may be lifted and placed at a predetermined position. With such a structure, the heat pipe 7 can be directly bonded to and sealed on the vacuum chamber 8 without using the bellows 96. In the use of the bellows 96 described above, if the bellows 96 is broken, the interior of the vacuum chamber 8 is exposed to the atmosphere, causing contamination of the inner wall. When the inner wall of the vacuum chamber 8 is contaminated, the inner wall needs to be cleaned because the vacuum chamber 8 serves as a gas source. Owing to this, the bellows 96 preferably has a double structure. For example, the structure shown in FIG. 1 is preferably configured such that a space between an outer wall of a heat discharge tank 95 and an outer wall of the vacuum chamber 8 is covered with a coating cover (not shown) to include the bellows 96. In this case, it is preferable that connection parts between the heat pipe 7 and the heat discharge tank 95 and between the heat discharge tank 95 and the coating cover, and between the vacuum chamber 8 and the coating cover are hermetically sealed, and the coating cover has a flexible or bellows portion. This is because the heat discharge tank 95 can also be moved by the movement of the electromagnets 3. To evacuate the inside of the vacuum chamber 8, an exhaust device (not shown) is connected.

As mentioned above, various electromagnets, such as one having the core 31, one having the yoke 33, and one having the covering member 34, can be used as the electromagnet 3. The shape of the core 31 may be square or circular. For example, when the size of the deposition mask 1 is about 1.5 m×1.8 m, a plurality of electromagnets 3, each having a core 31 (each electromagnet being referred to as a unit electromagnet), in which a cross-section of the unit electromagnet shown in FIG. 1 is about 5 cm square, can be arranged side by side along with the size of the deposition mask 1 as shown in FIG. 1 (the size thereof in the horizontal direction is scaled down and the number of unit electromagnets is shown to be few in FIG. 1). Although the connection of the coils 32 is not shown in the example shown in FIG. 1, the coils 32 wound around the respective cores 31 are connected in series. However, the coils 32 of the respective unit electromagnets may be connected in parallel. Several units may be connected in series. A current may be independently applied to a part of the unit electromagnet. The electromagnets 3 are cooled by the method of the respective examples described above.

Figure 9:
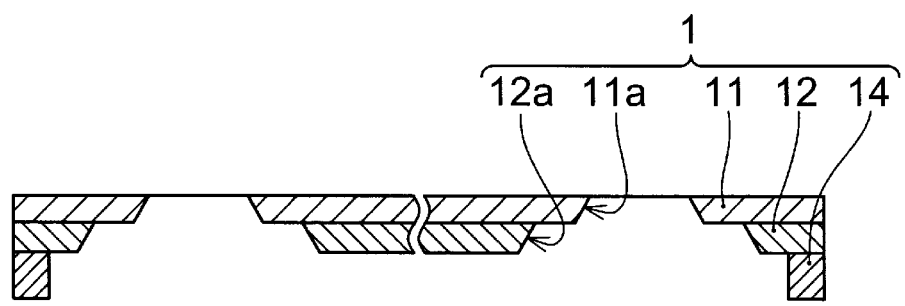
FIG. 9 is an enlarged view of an example of a deposition mask.

As shown in FIG. 9, the deposition mask 1 includes a resin film 11, a metal support film 12, and a frame (frame body) 14 formed around the resin film 11 and the metal support film 12. In the deposition mask 1, as shown in FIG. 1, the frame 14 is placed on the mask holder 15. A magnetic material is used for the metal support film 12. As a result, an attractive force acts between the deposition mask 1 and the core 31 of the electromagnet 3 to attract the deposition mask 1 with the substrate for vapor deposition 2 sandwiched therebetween. The metal support film 12 may be made of a ferromagnetic material. In this case, the metal support film 12 is magnetized by a strong magnetic field of the electromagnets 3 (in a state where strong magnetization remains even after an external magnetic field is removed). When such a ferromagnetic material is used, the electromagnet 3 and the deposition mask 1 can be easily separated from each other just by applying a current in the opposite orientation to the electromagnet 3 when intending to separate the electromagnet 3 and the deposition mask 1 from each other. Even when a strong magnetic field for such magnetization is generated, the present embodiment can suppress the heating of the electromagnet 3.

As the metal support film 12, for example, Fe, Co, Ni, Mn, or an alloy thereof can be used. Among them, invar (an alloy of Fe and Ni) is particularly preferable because this has a small difference in the coefficient of linear expansion from the substrate for vapor deposition 2 and hardly expands due to heat. The metal support film 12 is formed to have a thickness of about 5 µm to 30 µm.

In FIG. 9, an opening 11a of the resin film 11 and an opening 12a of the metal support film 12 are tapered to become smaller toward the substrate for vapor deposition 2 (see FIG. 1). The reason for this is to prevent the evaporated vapor deposition material 51 from being blocked when the vapor deposition material 51 is vapor-deposited (see FIG. 1). It should be noted that various types of vapor deposition sources 5, such as a point-shaped, a linear-shaped, and a planer-shaped ones, can be used as the vapor deposition source 5. For example, vapor deposition is performed on the entire surface of the substrate for vapor deposition 2 by scanning at the paper surface of FIG. 1 from its left end to its right end using a line-type vapor deposition source 5 (extending in a direction perpendicular to the paper surface of FIG. 1) in which crucibles are linearly arranged. Therefore, the above-mentioned taper is formed so that the vapor deposition material 51 evaporated from various directions and that even the vapor deposition material 51 coming from an oblique direction can reach the substrate for vapor deposition 2 without being blocked.

(Vapor Deposition Method)

Next, a vapor deposition method according to a second embodiment of the present invention will be described. As shown in FIG. 1 described above, the vapor deposition method in the second embodiment of the present invention includes: a step of overlaying the electromagnets 3, the substrate for vapor deposition 2, and the deposition mask 1 having a magnetic material and attracting the deposition mask 1 to the substrate for vapor deposition 2 by energization of the electromagnets 3; and a step of depositing the vapor deposition material 51 on the substrate for vapor deposition 2 by evaporating the vapor deposition material 51 from the vapor deposition source 5 disposed separately from the deposition mask 1, in which the vapor deposition material 51 is deposited while cooling the electromagnets 3 by using a heat pipes 7 that is in intimate contact with the electromagnets 3 at an area larger than the cross-sectional area within the inner perimeter of the coil 32 of the electromagnet 3.

As mentioned above, the substrate for vapor deposition 2 is overlaid on the deposition mask 1. The alignment between the substrate for vapor deposition 2 and the deposition mask 1 is performed as follows. The alignment is performed by moving the substrate for vapor deposition 2 relative to the deposition mask 1 while observing alignment marks respectively formed on the deposition mask 1 and the substrate for vapor deposition 2 by means of the image pickup device. At this time, as mentioned above, in a state where the electromagnet 3 is not operated, the alignment can be performed by bringing the substrate for vapor deposition 2 and the deposition mask 1 close to each other. According to this method, the opening 11a of the deposition mask 1 can be aligned with a corresponding vapor deposition position on the substrate for vapor deposition 2 (for example, a pattern of a first electrode 22 on a support substrate 21, in the case of an organic EL display apparatus to be described later). After the alignment, the electromagnets 3 are operated. Consequently, the strong attractive force acts between the electromagnets 3 and the deposition mask 1, thereby surely bringing the substrate for vapor deposition 2 and the deposition mask 1 close to each other. At this time, the coil 32 of each electromagnet 3 generates heat by causing a current to flow therethrough. However, as mentioned above, since the heat pipe 7 is connected to the electromagnet 3, the generated heat can be efficiently dissipated, so that the heat transfer to the deposition mask 1 hardly occurs, which suppresses a temperature increase of the deposition mask 1.

Thereafter, as shown in FIG. 1, the vapor deposition material 51 is deposited on the substrate for vapor deposition 2 by flying (vaporization or sublimation) the vapor deposition material 51 from the vapor deposition source 5 which is disposed separately from the deposition mask 1. Specifically, as mentioned above, line source formed by crucibles or the like arranged linearly is used, but the present invention is not limited thereto. For example, in the case of manufacturing an organic EL display apparatus, a plurality of types of deposition masks 1, each having openings 11a formed for some pixels, is prepared. Then, a vapor deposition process is repeatedly performed a multiple number of times by replacing one deposition mask 1 with another to thereby form organic layers.

According to this vapor deposition method, vapor deposition is performed while cooling the electromagnets 3 with the heat pipes 7. As a result, a relative misalignment between the deposition mask 1 and the substrate for vapor deposition 2 is suppressed, so that vapor deposition is performed with excellent accuracy. It is preferable that when a current into the electromagnet 3 is turned on and off, the rise and fall of the current become gentle from the viewpoint of suppressing the occurrence of electromagnetic induction. For example, it is preferable that a capacitor is connected in parallel with the electromagnet 3; that a terminal is provided at some midpoint in the coil 32 and then a part to be energized in the coil 32 is gradually enlarged; or that a reverse-wound part is formed in the coil 32, this part offset a generated magnetic field when the current to the electromagnet 3 is turned on or off, and a current flowing through the reverse coil part is gradually turned off after the current to the electromagnet 3 is turned on or off.

(Method of Manufacturing Organic EL Display Apparatus)

Next, a method of manufacturing an organic EL display apparatus using the vapor deposition method of the above embodiment will be described. Any processes in the manufacturing method other than the vapor deposition method can be performed by the well-known methods. Thus, a method of depositing organic layers by the vapor deposition method of the present invention will be mainly described with reference to FIGS. 10 and 11.

A method of manufacturing an organic EL display apparatus according to a third embodiment of the present invention includes: forming a TFT (not shown), a planarizing layer, and a first electrode (for example, an anode) 22 on the support substrate 21; aligning and overlaying the deposition mask 1 on one surface thereof; and forming an organic deposition layer 25 by using the above-described vapor deposition method to deposit the vapor deposition material 51. A second electrode 26 (see FIG. 11; a cathode) is formed on the organic deposition layer 25.

For example, although not shown completely, a driving element, such as a TFT, is formed on the support substrate 21, such as a glass plate, for each of RGB sub-pixels in each pixel, and the first electrode 22 connected to the driving element is formed, on the planarizing layer, by a combination of a metal layer made of Ag, APC, etc., and an ITO layer. As shown in FIGS. and 11, insulating banks 23 made of $SiO_2$, an acrylic resin, a polyimide resin, or the like are formed between the sub-pixels to isolate the sub-pixels from each other. The above-mentioned deposition mask 1 is aligned with and fixed on such insulating banks 23 on the support substrate 21. As shown in FIG. 1 described above, the fixing is performed by, for example, using the electromagnet 3, which is provided via a touch plate 4 on a surface opposite to the vapor deposition surface of the support substrate 21 (substrate for vapor deposition 2), to attract the deposition mask 1. As mentioned above, since the magnetic material is used as the metal support film 12 of the deposition mask 1 (see FIG. 9), the metal support film 12 of the deposition mask 1 is magnetized when a magnetic field is applied thereto by the electromagnet 3, thereby generating the attractive force between the core 31 and the metal support film. Even when the electromagnet 3 does not have the core 31, the deposition mask 1 is attracted to the electromagnets 3 by a magnetic field generated by a current flowing through the coil 32. At this time, as described above, the heat generated by the flowing current is rapidly transferred to and dissipated in the heat dissipation part 72 of the heat pipe 7. As a result, even if there is a difference in the coefficient of thermal expansion between the deposition mask 1 and the support substrate 21, the relative misalignment therebetween is significantly suppressed. In addition, the high-definition organic EL display apparatus can be obtained.

Figure 10:
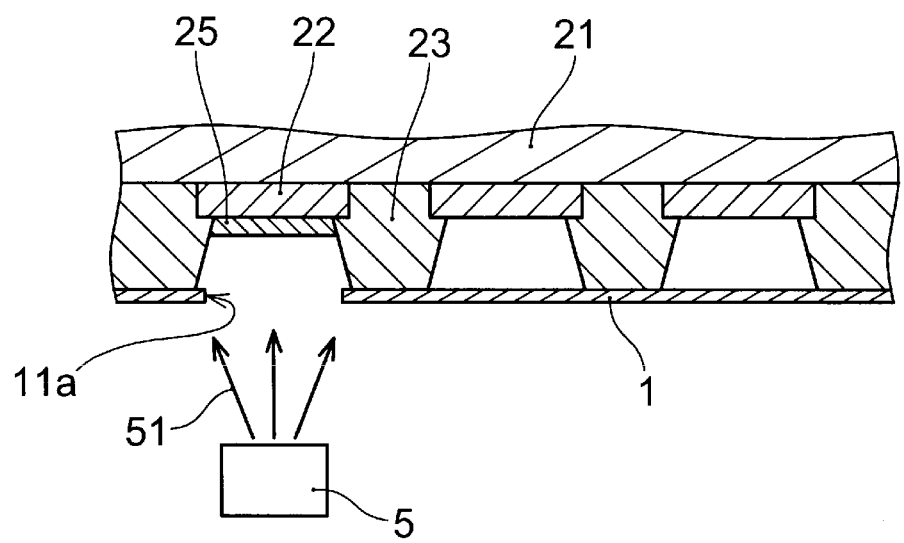
FIG. 10 is a diagram showing a vapor deposition process in the method of manufacturing an organic EL display apparatus according to the present invention.

In this state, as shown in FIG. 10, the vapor deposition material 51 is evaporated from the vapor deposition source (crucible) 5 in the vapor deposition apparatus, and then the vapor deposition material 51 is deposited only on parts of the support substrate 21 exposed from the openings 11a of the deposition mask 1, so that the organic deposition layer 25 is formed on the first electrode 22 in each of desired sub-pixels. This vapor deposition step may be performed on each sub-pixel by sequentially replacing one deposition mask 1 with another. Alternatively, the deposition mask 1 through which the same material is deposited concurrently on the plurality of sub-pixels may be used. When replacing the deposition mask 1, a power supply circuit (not shown) is turned off so as to remove a magnetic field applied to the metal support film 12 (see FIG. 9) of the deposition mask 1 through the electromagnets 3 (see FIG. 1), which is not shown in FIG. 10. Also at this time, the heat pipes 7 still act to transfer the whole heat remaining in the electromagnets 3 to the heat dissipation parts 72.

Figure 11:
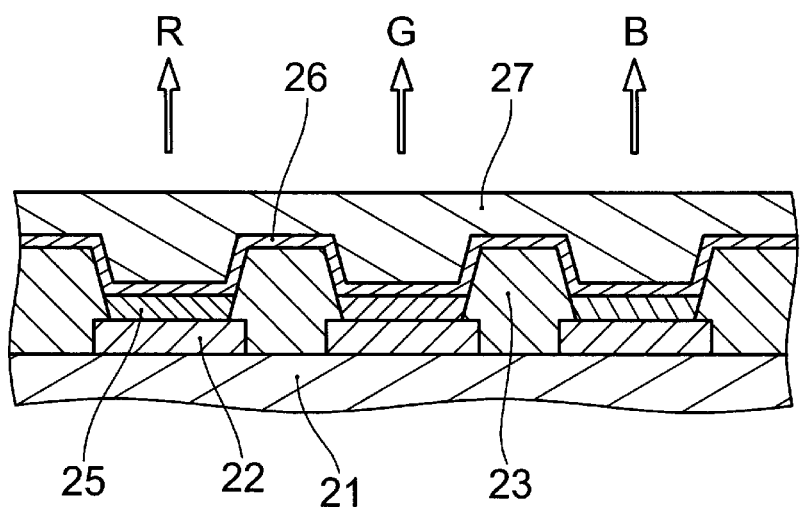
FIG. 11 is a diagram showing a state in which organic layers are deposited in the method of manufacturing the organic EL display apparatus of the present invention.

FIGS. 10 and 11 simply show that the organic deposition layer 25 is shown by a single layer, but the organic deposition layer 25 may be formed of a plurality of layers made of different organic materials. For example, a hole injection layer is provided as a layer in contact with the anode 22 in some cases. The hole injection layer improves a hole injection property and is made of materials having a good ionization energy matching. A hole transport layer which is made of, for example, an amine-based material, is provided on the hole injection layer. The hole transport layer improves stable transportability of holes and enables confinement of electrons (energy barrier) into a light emitting layer. Further, the light emitting layer, which is selected depending on emission wavelength to be emitted, is formed on the hole transport layer, for example, by doping red or green organic phosphor material into $Alq_3$, for the red or green wavelength. As a blue-based material, a bis(styryl)amine (DSA)-based organic material is used. An electron transport layer is formed of $Alq_3$ or the like on the light emitting layer. The electron transport layer improves an electron injection property and stably transports electrons. These respective layers, each having a thickness of about several tens of nm, are deposited to form the organic deposition layer 25. It should be noted that an electron injection layer, such as LiF or Liq, which improves the electron injection property, may also be provided between the organic layers and the metal electrode. In the present embodiment, these layers are included in the organic deposition layer 25.

In the organic deposition layer 25, an organic layer of a material corresponding to each color of RGB is deposited as the light emitting layer. In addition, the hole transport layer, the electron transport layer, and the like are preferably deposited separately by using materials suitable for the light emitting layer, if emphasis is placed on light emission performance. However, in consideration of the material cost, the same material common to two or three colors of RGB is deposited in some cases. In a case where the material common to sub-pixels of two or more colors is deposited, the deposition mask 1 is formed to have openings 11a formed in the sub-pixels sharing the common material. In a case where individual sub-pixels have different deposited layers, for example, one deposition mask 1 is used for sub-pixels of R, so that the respective organic layers can be sequentially deposited. In a case where an organic layer common to RGB is deposited, other organic layers for the respective sub-pixels are deposited up to the lower side of the common layer, and then at the stage of the common organic layer, the common organic layer is deposited across the entire pixels at one time using the deposition mask 1 with the openings 11a formed in RGB sites. In the case of mass production, a number of vacuum chambers 8 of the vapor deposition apparatuses may be arranged side by side, different deposition masks 1 may be mounted in the respective vacuum chambers 8, and the support substrate 21 (substrate for vapor deposition 2) may be moved to each vapor deposition apparatus to continuously perform vapor deposition.

After finishing the formation of the deposition layer of all the organic layers including the electron injection layer, such as a LiF layer, the electromagnets 3 are turned off, and then these electromagnet 3 are removed from the deposition mask 1 as mentioned above. Thereafter, a second electrode (e.g., a cathode) 26 is formed over the entire surface. An example shown in FIG. 11 is a top emission type, in which light is emitted from a surface opposite to the support substrate 21 shown in the figure. Thus, the second electrode 26 is formed of a light-transmissive material, for example, a thin Mg—Ag eutectic layer. Alternatively, Al or the like can be used. It should be noted that in a bottom emission type which emits light through the support substrate 21, ITO, $In_3O_4$, or the like can be used for the first electrode 22, and metals having low work functions, for example, Mg, K, Li, Al, or the like, can be used for the second electrode 26. A protective film 27 made of, for example, $Si_3N_4$ or the like, is formed on the surface of the second electrode 26. It should be noted that the whole laminated body is sealed by a sealing layer made of glass, a moisture-resistant resin film, or the like (not shown), and is thus configured to prevent the organic deposition layer 25 from absorbing moisture. Alternatively, a structure can also be provided in which the organic layers may be made common or shared as much as possible, and a color filter may be provided on the surface of the organic deposition layer.

(Summary)

(1) A vapor deposition apparatus according to the first embodiment of the present invention comprises: a vacuum chamber; a mask holder for holding a deposition mask disposed within the vacuum chamber; a substrate holder for holding a substrate for vapor deposition in contact with the deposition mask held by the mask holder; an electromagnet disposed on a surface, opposite to the deposition mask, of the substrate for vapor deposition held by the substrate holder; a vapor deposition source provided facing the deposition mask to vaporize or sublimate a vapor deposition material; and a heat pipe including at least a heat absorption part at a first end part thereof and a heat dissipation part at a second end part thereof opposite to the first end part, the heat absorption part being provided in contact with the electromagnet, and the heat dissipation part being derived to an outside of the vacuum chamber, wherein the heat pipe and the electromagnet are configured to be joined together in intimate contact with each other at an area of a contact part between the heat pipe and the electromagnet, the area being equal to or more than a cross-sectional area within an inner perimeter of a coil of the electromagnet.

According to the vapor deposition apparatus of the embodiment of the present invention, the heat absorption part of the heat pipe is provided to be in contact with the electromagnet of the vapor deposition apparatus at an area equal to or more than the cross-sectional area within the inner perimeter of the coil of the electromagnet. Consequently, heat generated in the electromagnet can be dissipated quickly. That is, even if the heat absorption part of the heat pipe is in contact with the surface of the electromagnet opposite to the surface thereof facing the deposition mask, the heat pipe is in contact with the electromagnet in a wide range of the heat absorption part of the heat pipe, thereby achieving the heat dissipation across the entire electromagnet. As a result, this suppresses an increase in the temperature of the substrate for vapor deposition and the deposition mask due to the heat transferred from the electromagnet to the substrate for vapor deposition and the deposition mask. In this way, the alignment between the substrate for vapor deposition and the deposition mask due to an increase in the temperature thereof is suppressed, so that the vapor deposition material is deposited on the accurate position of the substrate for vapor deposition with an accurate pattern. Therefore, the high-definition display panel can be obtained.

(2) It is preferable that the electromagnet and the heat pipe are in contact with each other such that a temperature increase of the deposition mask due to the electromagnet is 10° C. or less. That is, as the contact area between the heat absorption part of the heat pipe and the electromagnet becomes larger, the temperature increase of the electromagnet is suppressed more, and the temperature increase of the substrate for vapor deposition and the deposition mask is also suppressed more.

(3) It is preferable that the electromagnet includes a columnar core, and a yoke is attached to one end part of the core, thereby forming an E-shaped yoke in which a cross-sectional shape including the core is an E shape, and the heat pipe is in intimate contact with the E-shaped yoke. By providing such a yoke, the contact area of the heat absorption part of the heat pipe with the electromagnet (yoke) can become larger, as well as strengthening the magnetic field in the vicinity of the deposition mask.

(4) It is preferable that the electromagnet comprises a covering member for integrating a columnar core and a coil formed by winding an electrical wire around the core, and the heat absorption part of the heat pipe is formed so as to be in intimate contact with the covering member. Although the covering of the electromagnet with the covering member restricts the heat dissipation through the radiation, since the electromagnet is originally disposed within the vacuum chamber, the heat dissipation effect through the radiation is slight. On the other hand, by covering with the covering member, the heat transfer due to conduction is obtained, and by embedding the heat absorption part of the heat pipe in the covering member, the heat dissipation effect is more likely to be obtained very effectively. In this case, the covering member is preferably made of material having a large thermal conductivity. By covering with such a covering member, this covering member is sufficiently in contact with the surroundings of the electrical wire (coil), which tends to generate heat the most. Consequently, the heat dissipation effect due to the thermal conduction is very significant.

(5) It is preferable that the electromagnet comprises a columnar core, and the heat absorption part of the heat pipe is embedded in the core up to a depth of ½ or more of a length of the core. It is the most preferable that the temperature increase of, especially, the surface (front surface) of the electromagnet facing the substrate for vapor deposition is suppressed. However, there are many cases in which the heat pipe must be in contact with the backside which is an opposite surface to the front surface of the electromagnet due to a limited space. Even in these cases, the temperature of the front surface of the electromagnet can be decreased by embedding the heat pipe up to a depth of a half or more of the core. The deeper the embedding depth is, the more preferable it is. The embedding depth is further preferably ⅔ or more of the core, or the extent that the heat pipe is exposed at the front surface of the core.

(6) It is preferable that the heat pipe is formed in a flat shape and then rolled in a ring shape to form a cylindrical body, and the heat absorption part of the cylindrical body is embedded in the core. The electromagnet with the core obtains a stronger magnetic field than an electromagnet with an air core. Therefore, it is not preferable to form a hole in the core from the viewpoint of the magnetic field. However, the hole extending in the axis direction does not vary influence on the magnetic field regardless of its depth. Therefore, the insertion of the heat absorption part of the heat pipe into the deep hole at a small cross-sectional area is preferable because the heat dissipation can become significant without weakening the magnetic field so much.

(7) It is preferable that the electromagnet comprises a columnar core, and a coating layer having a larger thermal conductivity than that of the core is formed on a vicinity of at least a contact part of the electromagnet with the heat pipe. As mentioned above, it is difficult to provide the heat pipe at the front surface of the electromagnet due to the limited space, and hence the heat pipe is placed in contact with the backside of the electromagnet in many cases. However, the thermal conductivity of iron forming the core is not excellent so much. Because of this, a coating layer with excellent thermal conductivity, such as a copper plating, is preferably formed in order to improve the thermal conductivity of the core. The formation of the coating layer is preferable positioned across the entire surface of the core including the concave portion (also including a yoke in a case where the yoke is provided). It is considered that the thermal conduction of heat from the core to the heat pipe is improved by forming the coating layer on at least the contact part between the electromagnet and the heat absorption part of the heat pipe.

(8) It is preferable that the heat absorption part of the heat pipe is formed in a planar shape, and the heat absorption part of the heat pipe is disposed in intimate contact with a surface of the electromagnet facing to the deposition mask. With this structure, the heat pipe has a special structure, and thereby only the heat absorption part of the heat pipe can be in contact with the front surface of the electromagnet. As a result, this is very preferable because the surface of the electromagnet facing to the deposition mask can be cooled.

(9) The heat pipe is connected to the vacuum chamber via a bellows. With such a structure, the electromagnet can be ascended and descended together with the substrate holder or the like.

(10) It is preferable that a second chamber covering the vacuum chamber is formed at an outer perimeter of the vacuum chamber, and a space between the vacuum chamber and the second chamber is set at a degree of vacuum lower than a degree of vacuum of an inside of the vacuum chamber. Even if the bellows is broken, the inside of the vacuum chamber can be suppressed from being contaminated by the atmosphere.

(11) It is preferable that a protective pipe for preventing leakage of a liquid from the heat pipe due to break of the heat pipe is formed at an outer perimeter of the heat pipe. Even if the heat pipe is broken, the inside of the vacuum chamber can be suppressed from being contaminated with liquid sealed in the heat pipe.

(12) A vapor deposition method according to the second embodiment of the present invention comprises a step of superimposing an electromagnet, a substrate for vapor deposition, and a deposition mask having a magnetic material, and attracting the deposition mask to the substrate for vapor deposition by energization of the electromagnet; and a step of depositing a vapor deposition material on the substrate for vapor deposition by vaporizing or sublimating the vapor deposition material from a vapor deposition source disposed separately from the deposition mask, wherein the vapor deposition material is deposited while cooling the electromagnet by using a heat pipe in intimate contact with the electromagnet at an area wider than a cross-sectional area within an inner perimeter of a coil of the electromagnet.

According to the vapor deposition method of the second embodiment of the prevent invention, the heat pipe is in intimate contact with the electromagnet at an area wider than the cross-sectional area within the inner perimeter of the coil in the electromagnet. Thus, even if the deposition mask is attracted by the electromagnet during the vapor deposition, the temperature increase of the electromagnet is suppressed. Furthermore, the temperature increase of the substrate for vapor deposition and the deposition mask are also suppressed. As a result, the misalignment between the substrate for vapor deposition and the deposition mask due to the thermal expansion can be suppressed, making it possible to perform the vapor deposition with good accuracy.

(13) It is preferable that the electromagnet is cooled such that a temperature increase of the deposition mask due to the electromagnet is 10° C. or less. The temperature increase of the electromagnet is suppressed, and as a result, the temperature increase of the deposition mask is reduced to 10° c. or less, whereby a displacement of the deposition layer made of the vapor deposition material with respect to the pixel is suppressed within an allowable range, thereby obtaining the high-accuracy deposited film.

(14) Further, a method of manufacturing an organic EL display apparatus according to the third embodiment of the present invention comprises: forming a support substrate having at least a TFT and a first electrode; forming an organic deposition layer by depositing organic materials on the support substrate using the vapor deposition method according to the above-mentioned (12) or (13); and forming a second electrode on the organic deposition layer.

According to the method of manufacturing an organic EL display apparatus of the third embodiment in the present invention, the heat release from the electromagnet is suppressed when manufacturing the organic EL display apparatus, which suppresses the misalignment between the substrate for vapor deposition and the deposition mask, thereby obtaining the display panel with high definition.

REFERENCE SIGNS LIST

1 Deposition mask
2 Substrate for vapor deposition
3 Electromagnet
4 Touch plate
5 Vapor deposition source
7 Heat pipe
8 Vacuum chamber
12 Metal support film
15 Mask holder
21 Support substrate
22 First electrode
23 Insulating bank
25 Organic deposition layer
26 Second electrode
29 Substrate holder
31 Core (magnetic core)
31b Coating layer
32 Coil
33 Yoke
34 Covering member
41 Support frame
51 Vapor deposition material
71 Heat absorption part
72 Heat dissipation part
73 Space
78 Protective pipe
80 Wick structure
81 Case (container)
82 Wick
83 Wick core
84 Groove
96 Bellows

The invention claimed is:
1. A vapor deposition apparatus, comprising:
a vacuum chamber;
a mask holder for holding a deposition mask disposed within the vacuum chamber;
a substrate holder for holding a substrate for vapor deposition in contact with the deposition mask held by the mask holder;
an electromagnet disposed above a surface, opposite to the deposition mask, of the substrate for vapor deposition held by the substrate holder;
a vapor deposition source provided facing the deposition mask to vaporize or sublimate a vapor deposition material; and a heat pipe comprising a container, and an operating fluid sealed in the container, and further including at least a heat absorption part at a first end part of the heat pipe and a heat dissipation part at a second end part of the heat pipe opposite to the first end part, the heat absorption part being provided in contact with the electromagnet, and the heat dissipation part being derived to an outside of the vacuum chamber, wherein the heat pipe is configured to transmit heat generated by the electromagnet from the heat absorption part to the heat dissipation part by the operating fluid evaporating to generate vapor in the heat absorption part and the vapor passing through a space in the container and being condensed and liquefied in the heat dissipation part to discharge heat to the outside of the vacuum chamber, wherein the heat pipe comprises a vapor pipe to flow a vapor in the vapor pipe connected between an end part of the heat absorption part and an end part of the heat dissipation part, and a connection pipe to flow a liquid connected between another end part of the heat absorption part and another end part of the heat dissipation part to be formed as a loop-type heat pipe, wherein the heat absorption part of the loop-type heat pipe comprises a plurality of wick structures arranged horizontally side by side to be formed in a plate-shaped form, and wherein each of the plurality of wick structures comprises a wick core at a center part of each of the wick structures, and a wick is formed in a gear-like shape around the wick core, and grooves are formed between teeth of the wick to provide a path for vapor.

2. The vapor deposition apparatus according to claim 1, wherein the heat absorption part of the heat pipe is installed between a surface of the electromagnet facing the deposition mask and the substrate for vapor deposition held by the substrate holder.

3. A vapor deposition apparatus, comprising:
a vacuum chamber;
a mask holder for holding a deposition mask disposed within the vacuum chamber;
a substrate holder for holding a substrate for vapor deposition in contact with the deposition mask held by the mask holder;
an electromagnet disposed above a surface, opposite to the deposition mask, of the substrate for vapor deposition held by the substrate holder;
a vapor deposition source provided facing the deposition mask to vaporize or sublimate a vapor deposition material; and
a heat pipe including at least a heat absorption part at a first end part of the heat pipe and a heat dissipation part at a second end part of the heat pipe opposite to the first end part, the heat absorption part being provided in contact with the electromagnet, and the heat dissipation part being derived to an outside of the vacuum chamber,
wherein the electromagnet comprises a core, a coil, and a yoke, and the core, the coil, and the yoke are integrated with each other with a resin member, and
wherein the heat absorption part of the heat pipe is embedded within the resin member.

4. The vapor deposition apparatus according to claim 3, wherein the resin member comprises a heat-resistant resin.

5. The vapor deposition apparatus according to claim 3, wherein the resin member comprises a filler including a metal powder.

6. A vapor deposition apparatus, comprising:
a vacuum chamber;
a mask holder for holding a deposition mask disposed within the vacuum chamber;
a substrate holder for holding a substrate for vapor deposition in contact with the deposition mask held by the mask holder;
an electromagnet disposed above a surface, opposite to the deposition mask, of the substrate for vapor deposition held by the substrate holder;
a vapor deposition source provided facing the deposition mask to vaporize or sublimate a vapor deposition material; and
a heat pipe including at least a heat absorption part at a first end part of the heat pipe and a heat dissipation part at a second end part of the heat pipe opposite to the first end part, the heat absorption part being provided in contact with the electromagnet, and the heat dissipation part being derived to an outside of the vacuum chamber, wherein the electromagnet comprises a core having a concave portion in one end part of the core, and wherein the heat absorption part of the heat pipe is embedded in the concave portion.

7. The vapor deposition apparatus according to claim 6, wherein, when a cross-sectional shape of the heat pipe is a circular shape having a radius of "r", a cross-sectional shape of the core is a circular shape having a radius of "R" and a depth of the concave portion is "d", where $d \geq (R^2-r^2)/2r$.

8. The vapor deposition apparatus according to claim 6, wherein a coating layer having a thermal conductivity larger than a thermal conductivity of the core is formed on at least a part of a surface of the core and an inner surface of the concave portion, and the heat absorption part is bonded within the concave portion using an adhesive having a thermal conductivity larger than the thermal conductivity of the core.

9. The vapor deposition apparatus according to claim 6, wherein a resin containing fine particles having a thermal conductivity larger than a thermal conductivity of the resin is filled in a gap between the heat pipe and the core.

10. The vapor deposition apparatus according to claim 6, wherein the core comprises a powder magnetic core that is formed by an iron powder sintered and pressurized.

11. A vapor deposition apparatus, comprising:
a vacuum chamber;
a mask holder for holding a deposition mask disposed within the vacuum chamber;
a substrate holder for holding a substrate for vapor deposition in contact with the deposition mask held by the mask holder;
an electromagnet disposed above a surface, opposite to the deposition mask, of the substrate for vapor deposition held by the substrate holder;
a vapor deposition source provided facing the deposition mask to vaporize or sublimate a vapor deposition material; and
one or a plurality of heat pipes, each comprising a container, and an operating fluid sealed in the container, and further including at least a heat absorption part at a first end part of each of the heat pipes and a heat dissipation part at a second end part of each of the heat pipes opposite to the first end part, the heat absorption part being provided in contact with the electromagnet, and the heat dissipation part being derived to an outside of the vacuum chamber, wherein each of the heat pipes is configured to transmit heat generated by the electromagnet from the heat absorption part to the heat dissipation part by the operating fluid evaporating to generate vapor in the heat absorption part and the vapor passing through a space in the container and being condensed and liquefied in the heat dissipating part to discharge heat to the outside of the vacuum chamber, wherein the electromagnet comprises a core, the heat pipe has a cross-sectional area smaller than a cross-sectional area of the core, and each heat absorption part is embedded in the core.

12. A method of manufacturing an organic EL display apparatus, comprising:

forming a support substrate having at least a TFT and a first electrode;

forming an organic deposition layer by depositing organic materials on the support substrate using the vapor deposition apparatus according to claim 3; and forming a second electrode on the organic deposition layer.

\* \* \* \* \*